(12) United States Patent
Shigeta et al.

(10) Patent No.: US 8,717,474 B2
(45) Date of Patent: May 6, 2014

(54) IMAGING APPARATUS AND METHOD FOR DRIVING THE SAME

(75) Inventors: Kazuyuki Shigeta, Yokohama (JP); Seiji Hashimoto, Yokohama (JP); Keisuke Ota, Tokyo (JP); Takeru Ohya, Machida (JP)

(73) Assignee: Canon Kabushiki Kaisha, Tokyo (JP)

( * ) Notice: Subject to any disclaimer, the term of this patent is extended or adjusted under 35 U.S.C. 154(b) by 698 days.

(21) Appl. No.: 12/955,457

(22) Filed: Nov. 29, 2010

(65) Prior Publication Data

US 2011/0134295 A1    Jun. 9, 2011

(30) Foreign Application Priority Data

Dec. 4, 2009 (JP) ................................. 2009-276763
Dec. 4, 2009 (JP) ................................. 2009-276775

(51) Int. Cl.
*H04N 3/14* (2006.01)
*H04N 5/202* (2006.01)

(52) U.S. Cl.
USPC .......................................... 348/300; 348/255

(58) Field of Classification Search
USPC ................................................. 348/300, 255
See application file for complete search history.

(56) References Cited

U.S. PATENT DOCUMENTS

| 4,742,392 | A | 5/1988 | Hashimoto |
| 4,935,808 | A | 6/1990 | Hashimoto |
| 6,518,910 | B2 | 2/2003 | Sakuragi et al. |
| 6,831,634 | B1 | 12/2004 | Shigeta |
| 7,079,129 | B2 | 7/2006 | Shigeta |
| 7,310,434 | B2 | 12/2007 | Shigeta |
| 7,825,975 | B2 | 11/2010 | Fowler |
| 7,830,436 | B2 | 11/2010 | Sumi et al. |
| 2004/0080637 | A1 | 4/2004 | Nakamura et al. |
| 2005/0168602 | A1 | 8/2005 | Sumi et al. |
| 2009/0213258 | A1 | 8/2009 | Fowler |
| 2012/0104235 | A1 | 5/2012 | Sumi et al. |

FOREIGN PATENT DOCUMENTS

| JP | 11331709 | 11/1999 |
| JP | 2004015701 | 1/2004 |
| JP | 2004-229257 A | 8/2004 |
| JP | 2005-175517 A | 6/2005 |
| WO | 2009/108557 A2 | 9/2009 |

*Primary Examiner* — Joel Fosselman
(74) *Attorney, Agent, or Firm* — Fitzpatrick, Cella, Harper & Scinto

(57) ABSTRACT

An imaging apparatus includes: a plurality of column amplifiers, each outputting, based on the same one pixel, first and second pixel signals derived by amplifying the signal by different amplifying factors p and q; a plurality of column A/D converters for performing analog to digital conversion of the first and second pixel signals obtained; a plurality of replacing units, each selecting the first pixel signal converted by the corresponding column A/D converter when the first pixel signal converted by the corresponding column A/D converter is smaller than a threshold value, and selecting the second pixel signal converted by the corresponding column A/D converter when the first pixel signal converted by the corresponding column A/D converter is equal to or larger than the threshold value; and a horizontal scanning circuit for successively selecting the first or second pixel signals selected by the replacing units.

17 Claims, 14 Drawing Sheets

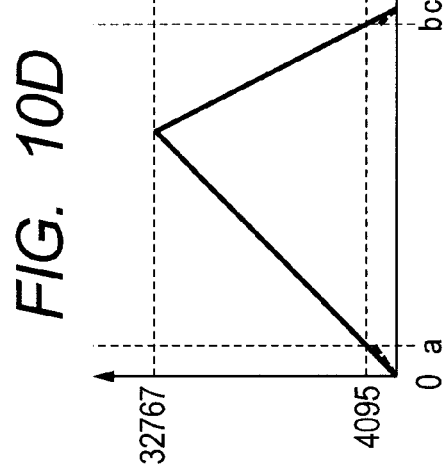
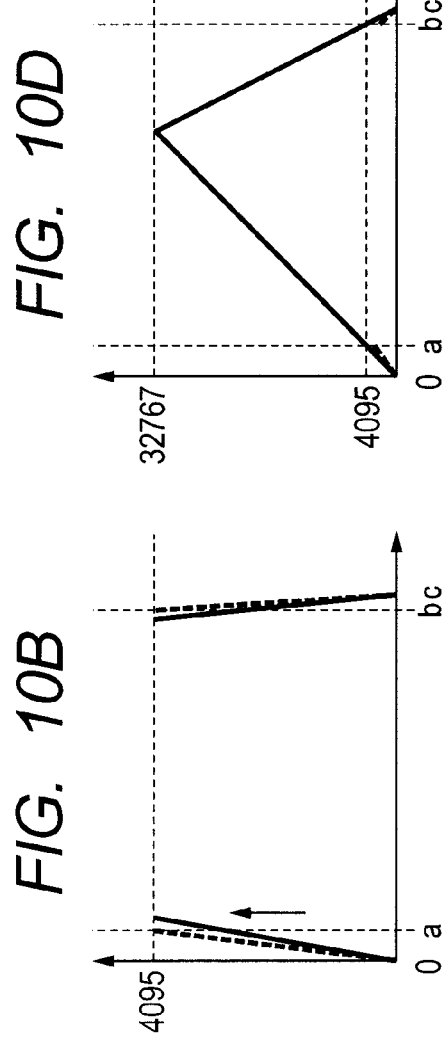
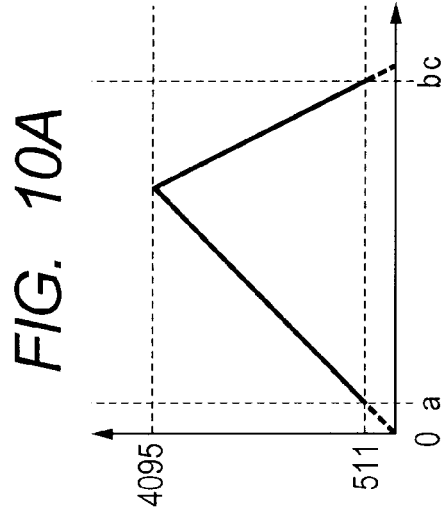
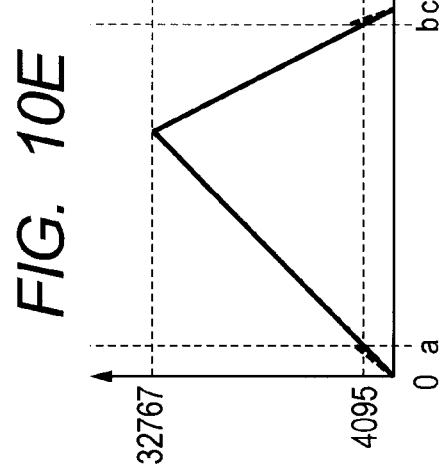
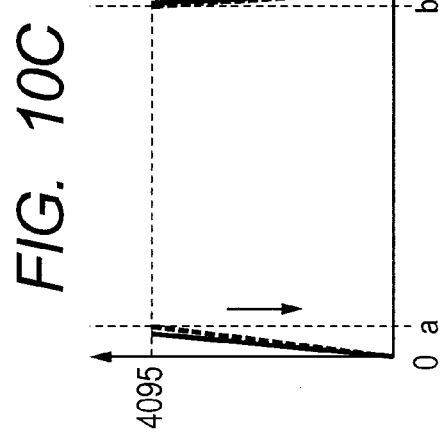

IMAGING APPARATUS AND METHOD FOR DRIVING THE SAME

BACKGROUND OF THE INVENTION

1. Field of the Invention

The present invention relates to an imaging apparatus and a method for driving the same.

2. Description of the Related Art

For solid-state imaging apparatuses, S/N ratio enhancement and dynamic range expansion have been demanded. To meet such demands, Japanese Patent Application Laid-Open No. 2004-015701 discloses that a detection circuit that detects the levels of pixel signals and an amplifier circuit are provided for each column of pixels arranged in a matrix to control amplification factors for the pixel signals for the respective signals, thereby expanding the dynamic range while maintaining the S/N ratio. Japanese Patent Application Laid-Open No. H11-331709 discloses that data derived by subjecting output signals from an imaging device to A/D conversion to provide signals for a relatively light area, and data derived by subjecting output signals from the imaging device to A/D conversion to provide signals for a relatively dark area are stored in respective memory units and subsequently combined, thereby enabling effective use of the dynamic range of the imaging device.

However, the technique disclosed in Japanese Patent Application Laid-Open No. 2004-015701 requires both a pixel signal level detection unit and a corresponding feedback unit for individually setting an amplification factor for each column of pixels, which may complicate the circuits within the sensor. Furthermore, the amplification factors are controlled based on the detection results, causing a problem in that a time lag equivalent to one frame occurs until reflection of the detection results. Meanwhile, the technique disclosed in Japanese Patent Application Laid-Open No. H11-331709 requires two memory units for storing both images of high intensity correction signals and pixel signals, resulting in an increase in circuit size. The technique also has the problem of an operation speed decrease because pixel signals and high intensity correction signals require exposure and read operations for two frames with different accumulation times.

SUMMARY OF THE INVENTION

In view of the aforementioned problems, an object of the present invention is to provide an imaging apparatus enabling S/N ratio enhancement and dynamic range expansion, and a method for driving the same.

The present invention provides an imaging apparatus comprising: a plurality of pixels, each including a photoelectric conversion element, arranged in a two-dimensional matrix; a plurality of column amplifiers each arranged correspondingly to each of columns of the plurality of pixels for outputting, a first pixel signal derived by amplifying by an amplifying factor p the signal from one of the pixels, and a second pixel signal derived by amplifying by an amplifying factor q the signal from the same one of the pixels, wherein the factors p and q are different from each other; a plurality of column A/D converters each arranged correspondingly to each of columns of the plurality of pixels for converting the first and second pixel signals outputted from a corresponding one of the plurality of column amplifiers; a plurality of replacing units each arranged correspondingly to each of columns of the plurality of pixels, wherein the replacing unit selects, based on a threshold value, either of the first pixel signal converted by the column A/D converter and the second pixel signal converted by the column A/D converter; and a horizontal scanning circuit for sequentially selecting the first or second pixel signals selected by the replacing units.

According to one aspect of the present invention, the imaging apparatus further comprises a bit conversion unit for outputting, based on the first or second pixel signals selected by the horizontal scanning circuit, a pixel signal derived by multiplying each first pixel signal by a first factor to increase the number of bits in the first pixel signal, or a pixel signal derived by multiplying each second pixel signal by a second factor to increase the number of bits in the second pixel signal, wherein the first and second factors are different from each other.

The present invention enables S/N ratio enhancement and dynamic range expansion.

Further features of the present invention will become apparent from the following description of exemplary embodiments with reference to the attached drawings.

BRIEF DESCRIPTION OF THE DRAWINGS

FIGS. 10A, 10B, 10C, 10D and 10E are diagrams each illustrating processing in a correcting unit and a bit converting unit in a first embodiment.

DESCRIPTION OF THE EMBODIMENTS

Preferred embodiments of the present invention will now be described in detail in accordance with the accompanying drawings.

First Embodiment

Figure 1:
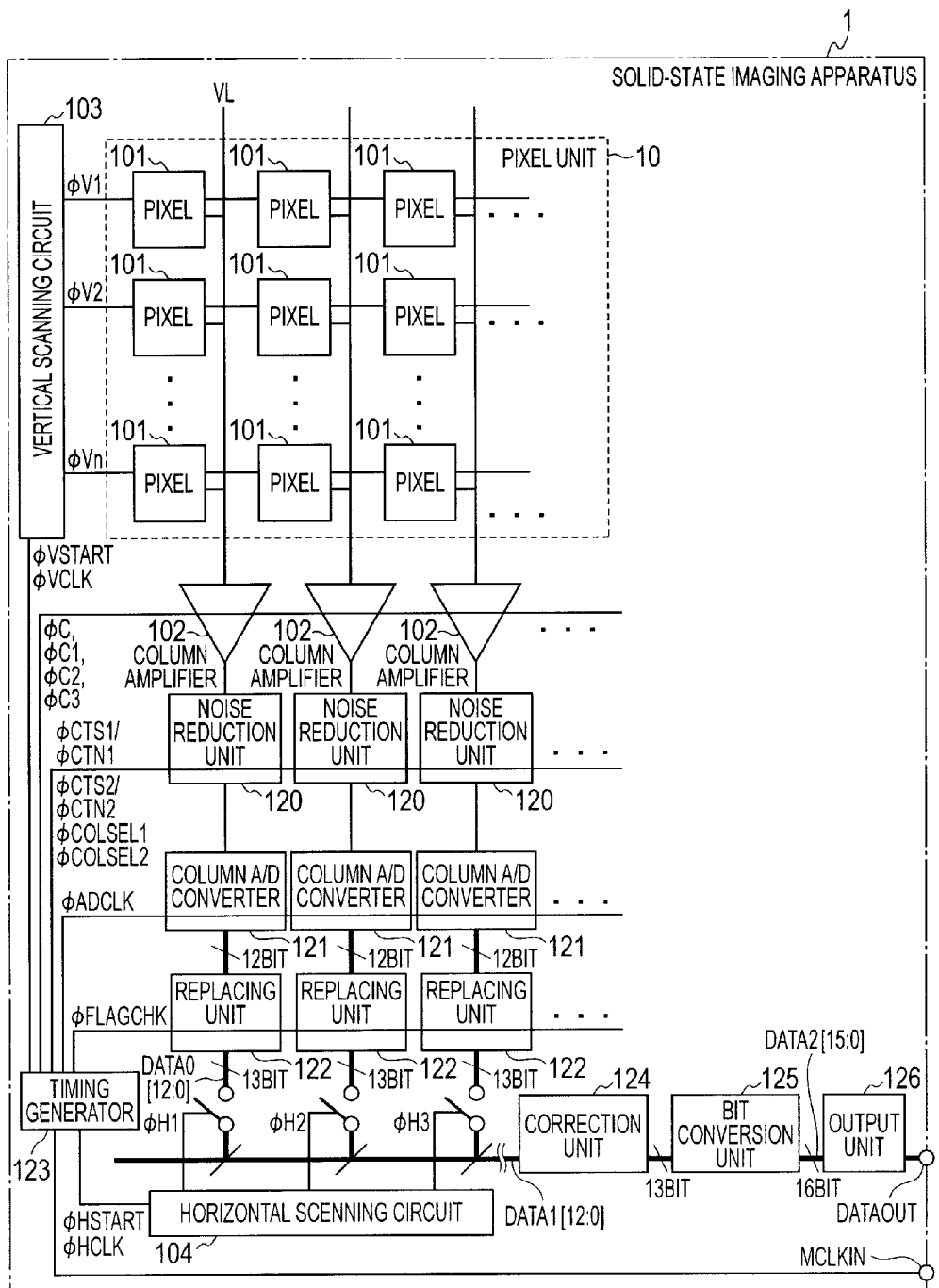
FIG. 1 is a configuration diagram of a solid-state imaging device according to a first embodiment.
Figure 3:
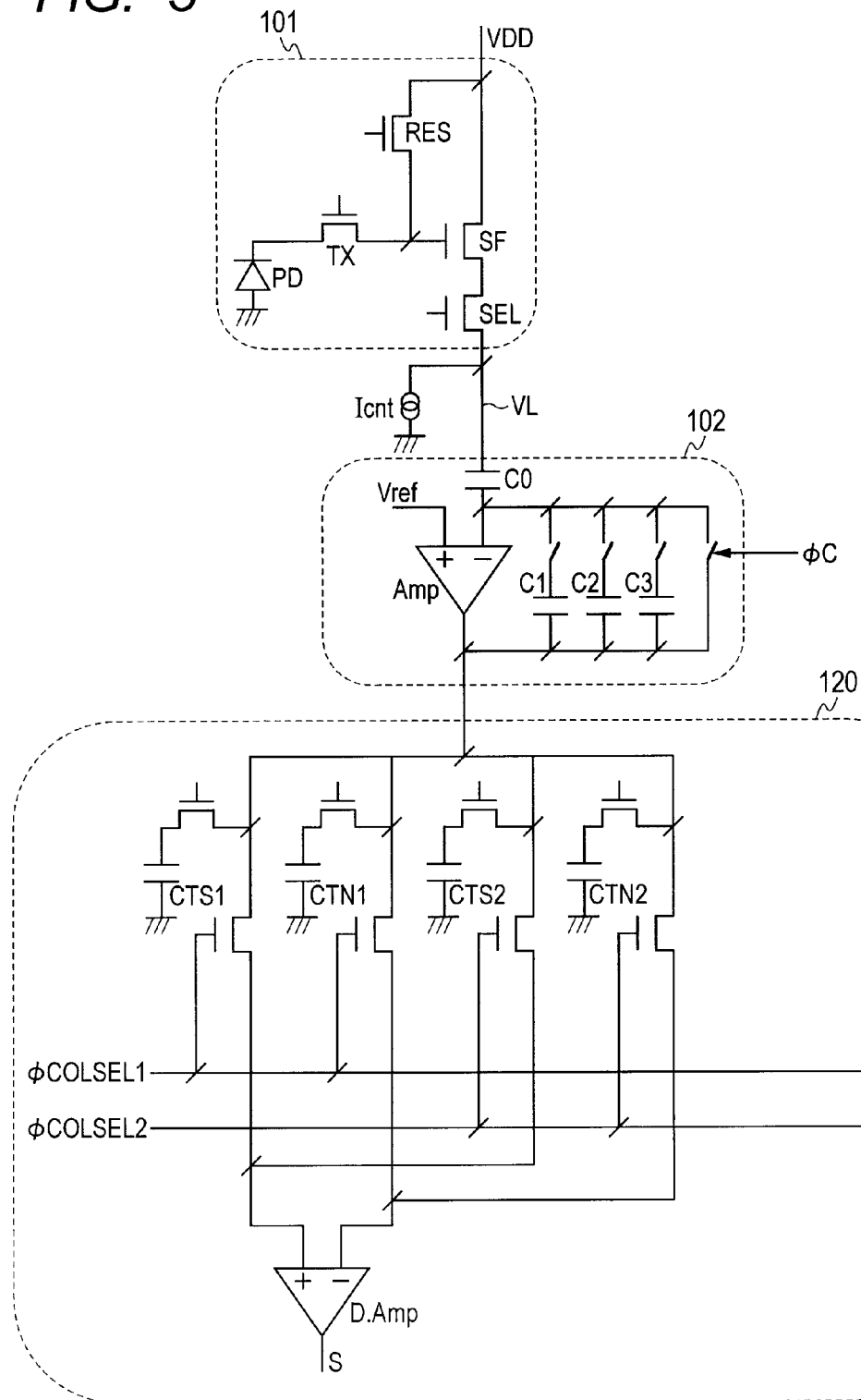
FIG. 3 is an equivalent circuit diagram more specifically illustrating a configuration of a pixel unit in a first embodiment.

FIG. 1 is a diagram illustrating a schematic example configuration of a solid-state imaging device (imaging apparatus) according to a first embodiment of the present invention. First, a principle for enhancing the S/N ratio of a signal and expanding the dynamic range of a solid-state imaging device will be described. A solid-state imaging device 1 includes a pixel unit 10 including pixels 101 arranged in a matrix, and a column amplifier 102, a noise reduction unit 120, a column A/D converter 121 and a replacing unit 122 for each column. The solid-state imaging device 1 also includes a vertical scanning circuit 103 for selecting a given row and a horizontal scanning unit 104 for successively reading signals from the row, in order to read data for one screen from the pixel unit 10. The pixel unit 10 includes a plurality of pixels 101 arranged in a two-dimensional matrix, each generating a signal using a photoelectric conversion element PD (FIG. 3). The solid-state imaging device 1 further includes a correcting unit 124, a bit converting unit 125 and an output unit 126 following a horizontal output signal line group that successively selects and reads signals in the respective columns via the horizontal scanning unit 104. Each pixel 101 includes a photoelectric conversion element that performs photoelectric conversion, and may further include, e.g., a pixel output unit that coverts charge generated in the photoelectric conversion element into a voltage signal and outputs the voltage signal, and/or a pixel selection unit for selecting the pixel 101. Although only nine pixels 101 are illustrated for simplicity of the Figure, it is assumed that there are m rows and n columns of pixels 101 in reality. The column amplifiers 102 can collectively change the amplification factors in all of the rows via column amplifier amplification factor control signals ϕC1, ϕC2 and ϕC3. Here, when reading a signal in one and the same row twice, the reading is performed using different amplification factors by changing the amplification factor. The noise reduction unit 120 reads both a noise component and a signal component containing the noise component from a pixel 101 and detects the difference therebetween, thereby extracting a signal component. Control pulses ϕCTS1, ϕCTN1, ϕCTS2, ϕCTN2, ϕCOLSEL1 and ϕCOLSEL2 are necessary for the noise reduction unit 120. Each column A/D converter 121 receives an A/D control signal, such as ϕADCLK, and performs analog-digital (A/D) conversion. Here, the column A/D converter 121 performs A/D conversion of each of the signals obtained as a result of reading a signal from the one and the same row twice. Each replacing unit 122 receives a replacement trigger signal ϕFLAGCHK and determines whether or not to replace a digital signal read for the first time with a digital signal read for the second time for a respective column, and performs the replacement if a certain condition is met. Consequently, one of the signals obtained as a result of reading twice is selected. The correcting unit 124 performs an operation to correct the error between the two types of signals read with different amplification factors. The bit converting unit 125 performs digital amplification factor conversion of a signal derived from at least one of the two types of signals read using the different amplification factors, from among the signals input thereto, and outputs the read signal with the number of bits increased. The output unit 126, which is an output circuit unit that conveys image signals from the solid-state imaging device 1 to an external system, converts image signals into a format of, for example, low-voltage amplitude differential signal pairs, and outputs the signals to the outside. A timing generator 123 counts and decodes clocks received from a terminal MCLKIN, thereby generating drive pulses and control signals to be sent to the respective units. With the circuit configuration as described above, one of the signals amplified by two different amplification factors can be selected inside the solid-state imaging device 1.

Figure 2A:
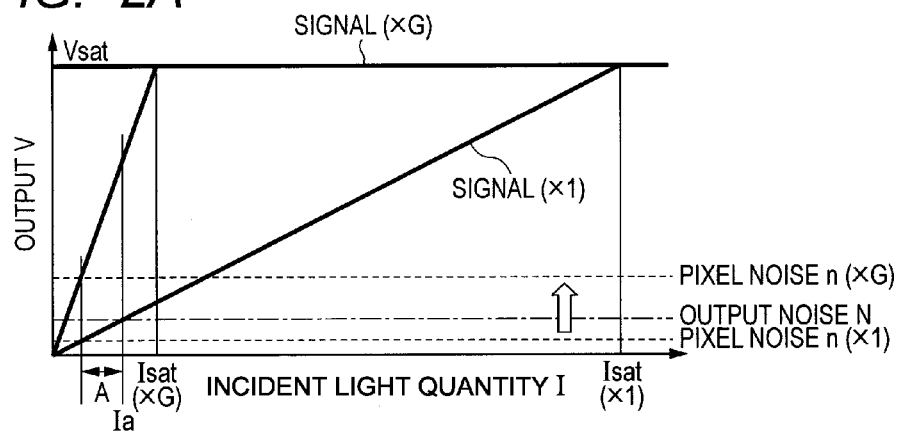
FIGS. 2A, 2B and 2C are diagrams each illustrating components of signals from a column A/D converter.

The relationship between the quantity of incident light on a pixel 101 and signal components output from a column A/D converter 121 where the amplification factor of a column amplifier 102 is 1 in the solid-state imaging device 1 illustrated in FIG. 1 is indicated by a "signal (×1)" in FIG. 2A. In FIG. 2A, the abscissa axis represents the incident light quantity and the ordinate axis represent the magnitude of an output from the column A/D converter 121. Where the incident light quantity exceeds a value Isat (×1), the output is saturated and has a saturated-level value Vsat. Here, the following discussion may be applied whether the case where the saturated-level value Vsat is a saturated-level value for the column amplifier 102 or a saturated-level value for the column A/D converter 121. In the Figure, a dashed line indicates pixel noise n caused from the pixel 101, and a dashed-dotted line indicates output noise N caused from the column A/D converter 121. The pixel noise n may be, for example, noise caused in the pixel output unit and/or the pixel selection unit included in the pixel. More specifically, where the pixel output unit forms a source follower circuit together with a constant current source provided to a vertical signal line VL, temporal fluctuations of the value of a current flowing in the constant current source may cause the pixel noise n. The output noise N includes noise caused by, for example, driving the column A/D converter 121. The pixel noise n and the output noise N are not consistently at a fixed level, and fluctuate over time. FIG. 2A illustrates the maximum levels of the respective noises when the noises fluctuate over time. In the present specification, amplification includes amplification by an amplification factor of 1.

As illustrated in FIG. 2A, where the amplification factor of the column amplifier 102 is 1, in general, the output noise N is larger than the pixel noise n (×1), and thus, the output noise N prevails. This result is attributed to the fact that pixels 101 are driven at a low speed and have a low bandwidth because they are horizontally scanned while output amplifiers are driven at a high speed and have a broad bandwidth because they successively outputs signals. In other words, a signal from a pixel 101 that has received an incident light quantity whose resulting signal (×1) would be smaller than the output noise N cannot correctly be extracted from the solid-state imaging device 1 because of the effect of the output noise N. For example, it is assumed that the level of an output from the solid-state imaging device 1 is v0. At the timing when the output v0 was output, the noise level may be so small that the incident light quantity can correctly be extracted, or the output may be v0 due to the effect of the noise even though an output of a level smaller than v0 should be obtained.

In FIG. 2A, amplifying a signal output from the pixel 101, which is the same as the pixel, from which the signal (×1) has been obtained, by an amplification factor of G (G>1) using a column amplifier 102 will be considered. The relationship between the incident light quantity and the output from the column A/D converter 121 is indicated by a "signal (×G)" in FIG. 2A. The signal (×G) reaches a saturated output value Vsat with an incident light quantity Isat (×G) that is smaller than that of the signal (×1). In other words, as the amplification factor of the column amplifier 102 is larger, the inclination of the straight line representing the output of the column A/D converter 121 relative to the incident light quantity is larger. Also, as a result of changing the amplification factor of the column amplifier 102, not only the signal component but also the pixel noise n are amplified by the amplification factor of G; however, the output noise N does not depend on the amplification factor of the column amplifier 102. Therefore, when the amplification factor of the column amplifier 102 is large, the amplified pixel noise n exceeds the output noise N. In other words, setting the amplification factor of the column amplifier 102 to G results in the prevailing of the amplified pixel noise n, while the output noise N is relatively small. Accordingly, a signal with an incident light quantity, which cannot correctly be extracted because of the prevalence of the output noise N when the amplification factor of the column amplifier 102 is 1, can be extracted. A range A is a range of the incident light quantity, the extraction of which has been enabled as a result of the amplification factor of the column amplifier 102 being multiplied by G. In other words, this means that the dynamic range of the solid-state imaging device 1 has been expanded by the quantity of the range A of the incident light quantity.

Figure 2B:
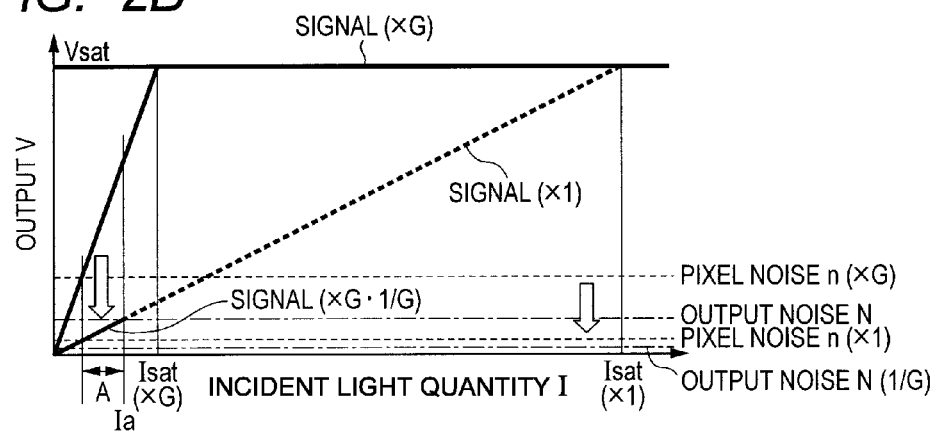

Therefore, use of the signal (×G) for the range in which the incident light quantity is from 0 to Ia and the signal (×1) for the region in which the incident light quantity is larger than Ia can be considered; however, the signal level may largely change with the incident light quantity Ia as the boundary. Accordingly, the signal (×G) output from the column A/D converter 121 is multiplied by 1/G in a processing circuit, which is a signal processing unit. The results are illustrated in FIG. 2B. The signal (×G) becomes a signal (×G, 1/G), which corresponds to the characteristic of the signal (×1). Similarly, as a result of the pixel noise n (×G) being multiplied by 1/G, the pixel noise n (×G) corresponds to the pixel noise n (×1). Meanwhile, the output noise N does not change when the amplification factor of the column amplifier 102 is multiplied by G, and thus, the output noise N becomes output noise N (1/G) when the output noise N is multiplied by 1/G in the processing circuit. In other words, as a result of the output noise N being multiplied by 1/G in the processing circuit, the noise component caused by the output noise N in the incident light quantity range of 0 to Isat is reduced, resulting in the signal (×G, 1/G) having a higher S/N ratio relative to the output noise N than that of the signal (×1).

Also, as in FIG. 2B, where Isat (×G) is larger than Ia, a signal with a high S/N ratio can also be obtained by using the signal (×G, 1/G) for the incident light quantity range of Ia to Isat (×G). In the region up to the incident light quantity of Isat (×G), an object is in a relatively dark condition, and thus, the effect of enhancement of the S/N ratio is particularly significant.

Figure 2C:
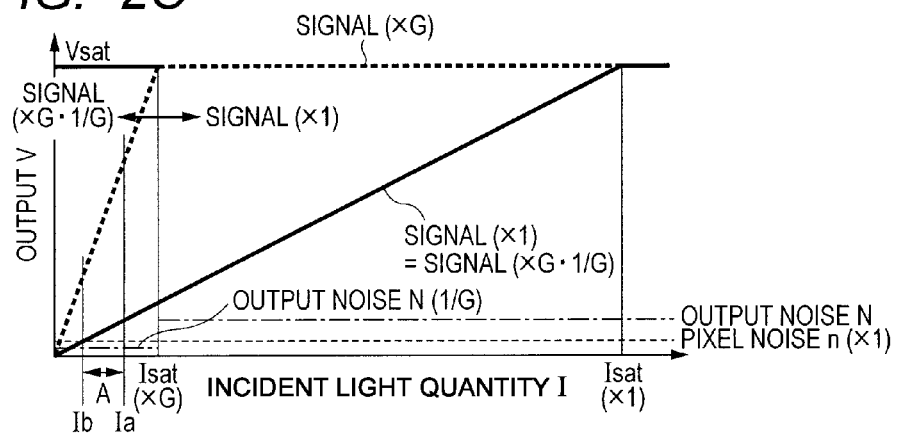

The above description is summarized in FIG. 2C. In the incident light quantity range of 0 to Isat, the signal (×G, 1/G) is used while in the incident light quantity range larger than Isat, the signal (×1) is used. Where the incident light quantity is Isat, either signal may be used; however, the signal (×G, 1/G) is favorably used because the signal (×G, 1/G) has a higher S/N ratio. Focusing on the output noise and the pixel noise, in the incident light quantity range of 0 to Isat, the pixel noise n (×1) prevails over the output noise N, and in the incident light quantity range larger than Isat, the output noise N prevails over the pixel noise n (×1). In FIG. 2C, in the range of the incident light quantity smaller than the incident light quantity range A, the signal (×G, 1/G) has a level lower than that of the pixel noise n (×1). Accordingly, the range in which a signal output from the solid-state imaging device 1 is effective is limited to a range in which the incident light quantity is larger than Ib. However, as described above, the output noise and the pixel noise fluctuate over time, and the maximum levels in the fluctuations are indicated in FIG. 2. Where images are consecutively obtained as in a moving picture, the noise components are averaged, and thus, have levels lower than the pixel noise n as a whole. Thus, a part of an image in a region in which the signal (×G, 1/G) is smaller than the pixel noise n (×1) can be recognized. In other words, suppression of the output noise N in the range in which the incident light quantity is small provides the advantage of enhancing the possibility that an incident light quantity having a level lower than that of the pixel noise n (×1) in FIG. 2B can be recognized as an image.

Also, the case where a signal output from one pixel is amplified by two types of amplification factors has been described above. However, according to the present embodiment, it is clear that a signal output from one pixel can be amplified by three or more types of amplification factors. Consequently, an enhanced S/N ratio can be provided for a broader incident light quantity range.

Although a description has been provided of the case where the amplification factor of the column amplifier 102 is set to 1 and G as an example, the amplification factor combination in the present invention is not limited to this example. For example, a combination of ×2 and ×16 or a combination of ×0.5 and ×4 may be employed.

Also, in the above description, the processing for multiplying the signal, which has been amplified by ×G, by ×1/G, that is, the reciprocal of the amplification factor of the column amplifier 102, has been performed. However, this processing is intended to adjust the characteristics of two types of signals derived by amplification by different amplification factors (so as to follow the same straight line in FIGS. 2A to 2C), and thus, the signal should not necessarily be multiplied by 1/G. For example, where one signal is amplified by amplification factors of 2 and 16 in the column amplifier 102, the signal amplified by the amplification factor of 16 is multiplied by ⅛, enabling adjustment of the characteristic of the signal to that of the other signal. Also, the signal amplified by the amplification factor of 2 is multiplied by ½ while the signal amplified by the amplification factor of 16 being multiplied by 1/16, enabling adjustment of the characteristics of the signals.

The objective of expanding the dynamic range and enhancing the S/N ratio can be achieved without adjusting the characteristics of the two signals. Reduction of the output noise N can be achieved by multiplying the signal, which has been amplified by the amplification factor of G, from among the two signals amplified by different amplification factors of 1 and G, by not 1/G but, for example, 1/(2G), and thus, dynamic range expansion and S/N ratio enhancement can be achieved. However, in this case, the continuity of the characteristic ceases with Isat (×G) in FIG. 2C as the boundary (i.e., an offset occurs), and thus, it is desirable to perform an offset correction.

Summarizing the above description, a signal amplified by an amplification factor of p and a signal amplified by an amplification factor of q are obtained by a column amplifier 102 from one signal output from a pixel. Here, it is assumed that p>q and 1<p. Then, the processing for multiplying the image signal output from the solid-state imaging device 1 by a factor that is smaller than 1 is performed on the signal amplified by the amplification factor of p, which is the higher amplification factor. Consequently, dynamic range expansion and S/N ratio enhancement can be achieved.

Furthermore, the factor that is smaller than 1 is made to be q/p, enabling the characteristic of the signal amplified by the amplification factor of p to be adjusted to that of the signal amplified by the amplification factor of q. If the signal amplified by the amplification factor of q is further multiplied by a factor of r, the factor that is smaller than 1 is made to be (q/p)×r, enabling the characteristics of the two signals be adjusted. In other words, the factor that is smaller than 1 may be a value having q/p as a submultiple.

The description of an example of the solid-state imaging device 1 according to the first embodiment of the present invention and the overview of operation thereof will be continued with reference to FIG. 1. Pixels 101 provided in a same column are connected to a column amplifier 102 via a same vertical signal line VL. Upon a pixel row Vn being selected by the vertical scanning circuit 103 according to a signal φVn, signals are output from pixels 101 connected to the pixel row Vn to the respective vertical signal lines VL, and amplified in the column amplifiers 102 according to the amplification factor set by the column amplifier amplification factor control signals φC1, φC2 and φC3. Here, in order to reduce noise caused by reset of each pixel, the signal immediately after the reset of the pixel and the signal after optical signal accumulation are amplified by a same amplification factor and then the difference between the signals is obtained by the corresponding noise reduction unit 120. The signal from which noise has been reduced by the noise reduction unit 120 is subjected to A/D conversion by the corresponding column A/D converter 121 at a timing determined by the A/D control signal φADCLK. Here, A/D conversion is performed after reading the signal from the same pixel row Vn, which has been subjected to noise reduction, twice with different amplification factors. A first digital signal and a second digital signal, which have been generated as a result of the A/D conversion, are sent to the corresponding replacing unit 122. In the replacing unit 122, first, the first digital signal is stored, and then using a signal φFLAGCHK as a trigger, whether or not to replace the first digital signal with the second digital signal is determined for the respective column and the first digital signal meeting a condition is replaced with the second digital signal. Here, a flag indicating whether or not the replacement has been made is stored for the respective column. Signals φH1, φH2, φH3 ..., for bus switches connecting a bus for output data DATA0 [12:0] from the replacing units 122 and a horizontal signal bus for output data DATA1 [12:0] are output by the horizontal scanning unit 104. Then, the bus switches are turned on, and the digital signals after the replacement from the respective columns are successively input to the correcting unit 124 in the order of the columns.

In the correcting unit 124, necessary correction processing is performed. With reference to the flags, the correcting unit 124 determines whether each original signal is the first digital signal or the second digital signal, and corrects the amplification factor errors caused by the column amplifiers 102 for the relevant signals. With reference to the flags, the bit converting unit 125 determines whether each original signal is the first digital signal or the second digital signal, and one or both of the signals are multiplied by a digital gain. More specifically, in the first digital signal derived by the multiplication by the amplification factor of p and the second digital signal derived by the multiplication by the amplification factor of q, the second digital signal is multiplied so as to have an amplification factor of roughly p/q relative to the first digital signal. The bit converting unit 125 performs bit conversion for the first signals or the second signals. In the bit conversion, the signal is subjected to an n-bit shift and multiplied by an amplification factor equivalent to $2^n$. Here, the bit converting unit 125 performs a three-bit shift to change the received 13-bit signals to 16-bit signals, which are data DATA2 [15:0]. The output unit 126 multiplexes, for example, the received signals from a 16-bit width bus, which are the data DATA2 [15:0], in order to reduce the number of signal lines, and converts the signals into low-amplitude differential pair signals in order to reduce the noise, and outputs the signals to the outside of the solid-state imaging device 1 as output signals DATAOUT. The timing generator 123 supplies signals to the vertical scanning circuit 103 and the horizontal scanning unit 104, and may further supply signals for controlling the column amplifiers 102, the noise reduction units 120, the column AD converters 121 and the replacing units 122. The timing generator 123 may be provided outside the solid-state imaging device 1, and also, the control signals may partially be supplied externally.

During a period in which image signals for one row are output from the solid-state imaging device 1 as described above, inside the device, an analog pixel signal is read from each pixel in a pixel row twice, and the read signals are amplified by different amplification factors and then one of a first digital signal and a second digital signal obtained as a result of A/D conversion of the signals is selected for each column. Subsequently, the signals are read successively from the respective columns and serialized, and then are subjected to correction and bit conversion.

A detailed configuration and operation of each unit will be described below. FIG. 3 is an equivalent circuit diagram illustrating more-detailed configurations of a column amplifier 102 and a noise reduction unit 120 for one pixel 101 in FIG. 1. The pixel 101 includes a photo diode PD, which is a photoelectric conversion element, and a transfer unit TX that transfers charge accumulated in the photo diode PD to a gate terminal of a MOS transistor included in a pixel output unit SF. The gate terminal, which is an input unit of the pixel output unit SF, is connected to a power supply VDD via a reset unit RES. A source terminal of the pixel output unit SF is connected to one terminal of an input capacitance C0 in the column amplifier 102 via a pixel selection unit SEL and also to a constant current source Icnt. The column amplifier 102 includes an operational amplifier Amp. An inverting input terminal of the operational amplifier Amp is connected to the other terminal of the input capacitance C0. Feedback capacitances C1, C2 and C3 are connected between the output terminal and the inverting input terminal of the operational amplifier Amp via respective switches. Furthermore, a switch for short-circuiting the inverting input terminal and the output terminal of the operational amplifier Amp is provided. A power supply Vref is provided to the non-inverting input terminal of the operational amplifier Amp. A signal output from the pixel 101 to a vertical signal line VL is amplified by an amplification factor determined by the ratio between the capacitance values of the feedback capacitances C1, C2 and C3 connected to a feedback route of the operational amplifier Amp, and the capacitance value of the input capacitance C0. Here, it is assumed that the capacitance values of the feedback capacitances C1, C2 and C3 are 1, ⅛ and 1/16 times the capacitance of the input capacitance C0, respectively. In other words, in the present embodiment, each column amplifier includes a column amplifier whose amplification factor is variable. Noise caused by the pixel is reduced in the input capacitance C0, which will be described later. Here, a first CDS (Correlated Double Sampling) circuit, which includes the input capacitance C0, the operational amplifier Amp, and a switch that receives a signal φC, is provided.

The signals amplified in the column amplifier 102 are selectively conveyed to retention capacitances CTS1, CTN1, CTS2 and CTN2 in the noise reduction unit 120 and retained therein. Signals based on charge obtained as a result of photoelectric conversion by the photo diode PD are retained in the retention capacitances CTS1 and CTS2, and signals based on the reset of the pixel output unit SF are retained in the retention capacitances CTN1 and CTN2. The signals retained in the retention capacitances CTS1 and CTN1 are connected to different input terminals of a differential amplifier D. Amp via switches that are brought into conduction by a signal φCOLSEL1. The signals retained in the retention capacitances CTS2 and CTN2 are connected to different input terminals of the differential amplifier D. Amp via switches that are brought into conduction by a signal φCOLSEL2. The differential amplifier D. Amp outputs the difference between the signals retained in the retention capacitances CTS1 and CTN1 and the difference between the signals retained in the retention capacitances CTS2 and CTN2 in times series. Here, a second CDS circuit, which includes the retention capacitances and the differential amplifier, is provided. An offset caused by the column amplifier 102 is reduced by the second CDS circuit.

Figure 4:
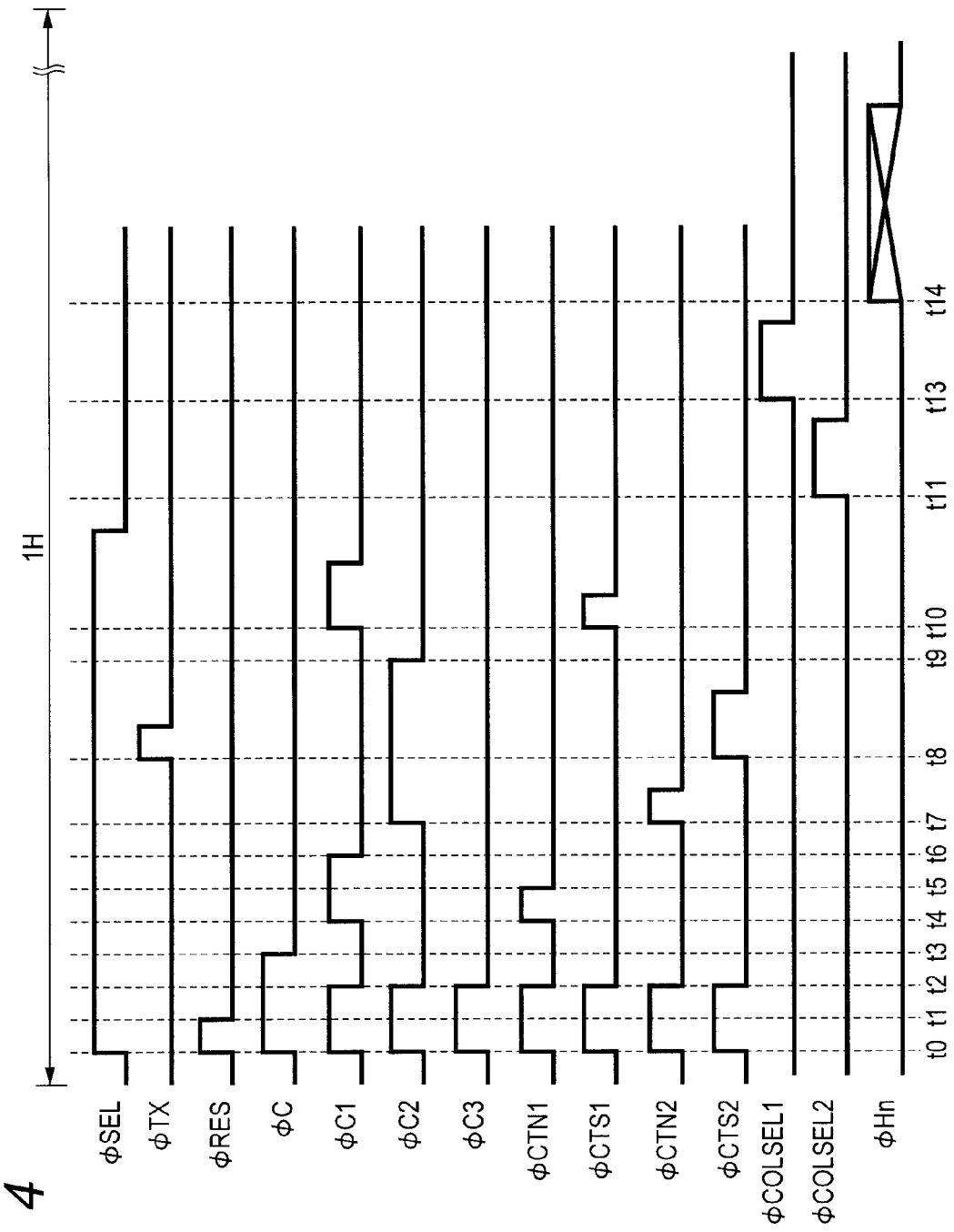
FIG. 4 is a diagram illustrating an operation in one horizontal scanning period in a first embodiment.

With reference to FIG. 4, first, a method for driving a solid-state imaging device 1 in one horizontal scanning period according to the pixel 101, the column amplifier 102 and the noise reduction unit 120 illustrated in FIG. 3 will be described. Here, this is a case where the feedback capacitances C1 and C2 are used, and their respective capacitance values are 1 and ⅛ times the capacitance value of the input capacitance C0. In other words, a case where one signal is amplified by amplification factors of 1 and 8 will be described. Also, in FIG. 3, signals φTX, φRES and φSEL are input to switches TX, RES and SEL, respectively, and the switches are brought into conduction when the signals are at a high level. Signals φC1, φC2 and φC3 are provided to switches provided between the feedback capacitances C1, C2 and C3 and the inverting input terminal of the operational amplifier Amp, respectively, and the switches are brought into conduction when the signals are at a high level. Signals φCTS1, φCTN1, φCTS2 and φCTN2 are provided to switches provided between the retention capacitances CTS1, CTN1, CTS2 and CTN2 and the output terminal of the column amplifier 102, respectively, and the switches are brought into conduction when the signals are at a high level.

First, at a time t0, the signals except the signal φTX and a signal φHn transition to a high level. When the signal φSEL transitions to a high level, the pixel selection unit SEL is brought into conduction, and thus, the source terminal of the pixel output unit SF and the constant current source Icnt are selectrically connected, forming a source follower circuit. Consequently, a signal exhibiting a level according to the potential of the gate terminal of the pixel output unit SF appears in the vertical signal line VL. At this timing, the signal φRES is at a high level, and thus, a signal exhibiting a level according to the state in which the gate terminal of the pixel output unit SF is reset appears in the vertical signal line VL. Also, as a result of the signals φC, φC1, φC2 and φC3 transitioning to a high level, respectively, the inverting input terminal and the output terminal of the operational amplifier Amp are short-circuited and the feedback capacitances C1, C2 and C3 are reset. As a result of virtual grounding of the operational amplifier Amp, respective the opposite terminals of the feedback capacitances C1 and C2 can be regarded as having the same potential to that of the power supply Vref. Since the signals φCTN1, φCTS1, φCTN2 and φCTS2 are at a high level, the retention capacitances CTN1, CTS1, CTN2 and CTS2 are reset by an output of the operational amplifier Amp.

At a time t1, the signal φRES transitions to a low level, the gate terminal of the pixel output unit SF is released from the reset state. A noise component generating as a result of the release of the reset state is a cause of the pixel noise n.

At a time t2, the signal φC1, φC2, φC3, φCTN1, φCTS1, φCTN2 and φCTS2 transition to a low level, and their respective corresponding switches are brought into non-conduction.

Subsequently, at a time t3, the signal φC transitions to a low level, releasing the input and output terminals of the operational amplifier Amp from the short-circuited state. In the input capacitance C0, the signal level according to the reset of the gate terminal of the pixel output unit SF is clamped by Vref.

At a time t4, the signal φC1 and φCTN1 transition to a high level, and at a time t5, the signal φCTN1 transitions to a low level. Consequently, the output of the column amplifier 102 at the time is retained in the retention capacitance CTN1. Here, since the signal φC1 is at a high level, only the feedback capacitance C1 is selectrically connected to the feedback route of the operational amplifier Amp. In other words, the amplification factor of the column amplifier 102 becomes C0/C1=C0/C0=1. The signal retained in the retention capacitance CTN1 contains an offset component caused by the column amplifier 102.

At a time t6, the signal φC1 transitions to a low level and at a time t7, the signal φC2 transitions to a high level. Consequently, only the feedback capacitance C2 is selectrically connected to the feedback route of the operational amplifier Amp. In other words, the amplification factor of the column amplifier 102 becomes C0/C2=C0/(C0/8)=8.

From the time t7, the signal φCTN2 exhibits a high level in the form of a pulse, and when the signal φCTN2 then transitions to a low level, the signal containing the offset component caused by the column amplifier 102 is retained in the retention capacitance CTN2.

When the signal φTX transitions to a high level at a time t8, the charge accumulated in the photo diode PD is transferred to the gate terminal of the pixel output unit SF. Consequently, the potential of the gate terminal of the pixel output unit SF changes, the signal level appearing in the vertical signal line VL also changes. Here, since the input capacitance C0 is in a floating state, only a potential equivalent to the change from the signal level of the vertical signal line VL that has been clamped at the time t1 is input to the inverting input terminal of the operational amplifier Amp. In other words, from among the noise components generated before the clamping of the capacitance, noise components correlated between the signal level of the vertical signal line VL at the time t3 and the signal level of the vertical signal line VL at the timings of a time t8 onward can be reduced by means of a clamping operation. Consequently, a signal based on photoelectric conversion is input to the operational amplifier Amp. However, e.g., fluctuations of a current flowing in the constant current source Icnt and noise, called "1/f noise", generated in the pixel output unit SF are different between the time t1 and the time t8 (i.e., not correlated), and thus, cannot be reduced by a clamping operation. In the present embodiment, such non-correlated noise component corresponds to the pixel noise n.

At the time t8, only the feedback capacitance C2 is present in the feedback route of the operational amplifier Amp having a capacitance value ⅛ times the capacitance value of the input capacitance C0, and thus, the signal based on the photoelectric conversion is amplified by an amplification factor of 8. From the time t8, the signal φCTS2 exhibits a high level in the form of a pulse, and the signal subjected to the 8-fold amplification in the column amplifier 102 is retained in the retention capacitance CTS2 as a result of the signal φCTS2 transitioning to a low level. The signal retained in the retention capacitance CTS2 contains an offset component caused by the column amplifier 102 as with the retention capacitance CTN2.

At a time t9, the signal φC2 transitions to a low level, and at a time t10, the signal φC1 transitions to a high level. Consequently, only the feedback capacitance C1 is selectrically connected to the feedback route of the operational amplifier Amp. The capacitance value of the feedback capacitance C1 is the same as that of the input capacitance C0, and thus, the signal input to the column amplifier 102 is amplified by an amplification factor of 1.

From a time t10, the signal φCTS1 exhibits a high level, and when the signal φCTS1 then transitions to a low level, a signal exhibiting a level as a result of the level appearing on the vertical signal line VL being amplified by an amplification factor of 1 is retained in the retention capacitance CTS1.

Here, the signal retained in the retention capacitance CTS1 contains an offset component caused by the column amplifier 102 as with the retention capacitance CTN1. Subsequently, as a result of the signal φSEL transitioning to a low level, the pixel selection unit SEL is turned off, and the pixel 101 is released from the selected state.

When the signal φCOLSEL2 transitions to a high level at a time t11, the signals retained in the retention capacitances CTS2 and CTN2 are output to the differential amplifier D. Amp, and a first pixel signal based on the signals is output to the following column A/D converter 121 from the differential amplifier D. Amp.

Subsequently, when the signal φCOLSEL1 transitions to a high level at a time t13, the signals retained in the retention capacitances CTS1 and CTN1 are output to the differential amplifier D. Amp, and a second pixel signal based on the signals is output to the following column A/D converter 121 from the differential amplifier D. Amp. The signals retained in the respective retention capacitances contain the offset components caused by the column amplifier 102, and thus, the respective differences between the signals are detected in the differential amplifier D. Amp, enabling reduction of the offset components. The differential amplifier D. Amp successively outputs a signal S2 amplified by the amplification factor of 8 and a signal S1 amplified by the amplification factor of 1. The signals S1 and S2 contain the aforementioned output noise N. The signals S1 and S2 here correspond to the output V in FIGS. 2A to 2C. The first pixel signal and the second pixel signal are subjected to A/D conversion in the column A/D converter 121, which will be described later, and then one of the first pixel signal and the second pixel signal is selected in the replacing unit 122 for each column as an output signal.

Subsequently, at a time t14, in response to drive pulses φHCLK from the horizontal scanning unit 104, data subsequent to the replacement in the respective columns are successively read out to the following correcting unit 124.

A column amplifier 102 is provided for each column of a plurality of pixels 101, and outputs a first pixel signal derived by amplifying a signal from a same pixel by a first amplification factor of p (for example, 8) and a second pixel signal derived by amplifying the signal by a second amplification factor of q (for example, 1) that is different from the first amplification factor of p. Also, the column amplifier 102 outputs the first pixel signal and the second pixel signal in time series. A noise reduction unit 120 is provided following the column amplifier 102 for each column of the plurality of the pixels 101. The noise reduction unit 120 outputs a differential signal between the signal amplified by the column amplifier 102 in the state in which the pixel 101 is reset and the signal amplified by the column amplifier 102 in the state in which the pixel 101 is released from the reset state to the column A/D converter 121. In the present embodiment, the column amplifiers 102 and the noise reduction units 120 are provided for the respective columns, and thus, parallel processing can be performed for one row of pixels. In other words, lower-speed driving is enabled compared to the case where the signals in the respective columns are read out to the horizontal signal line by the horizontal scanning unit 104 with an analog method, providing an advantage in that noise is unlikely caused.

Figure 5:
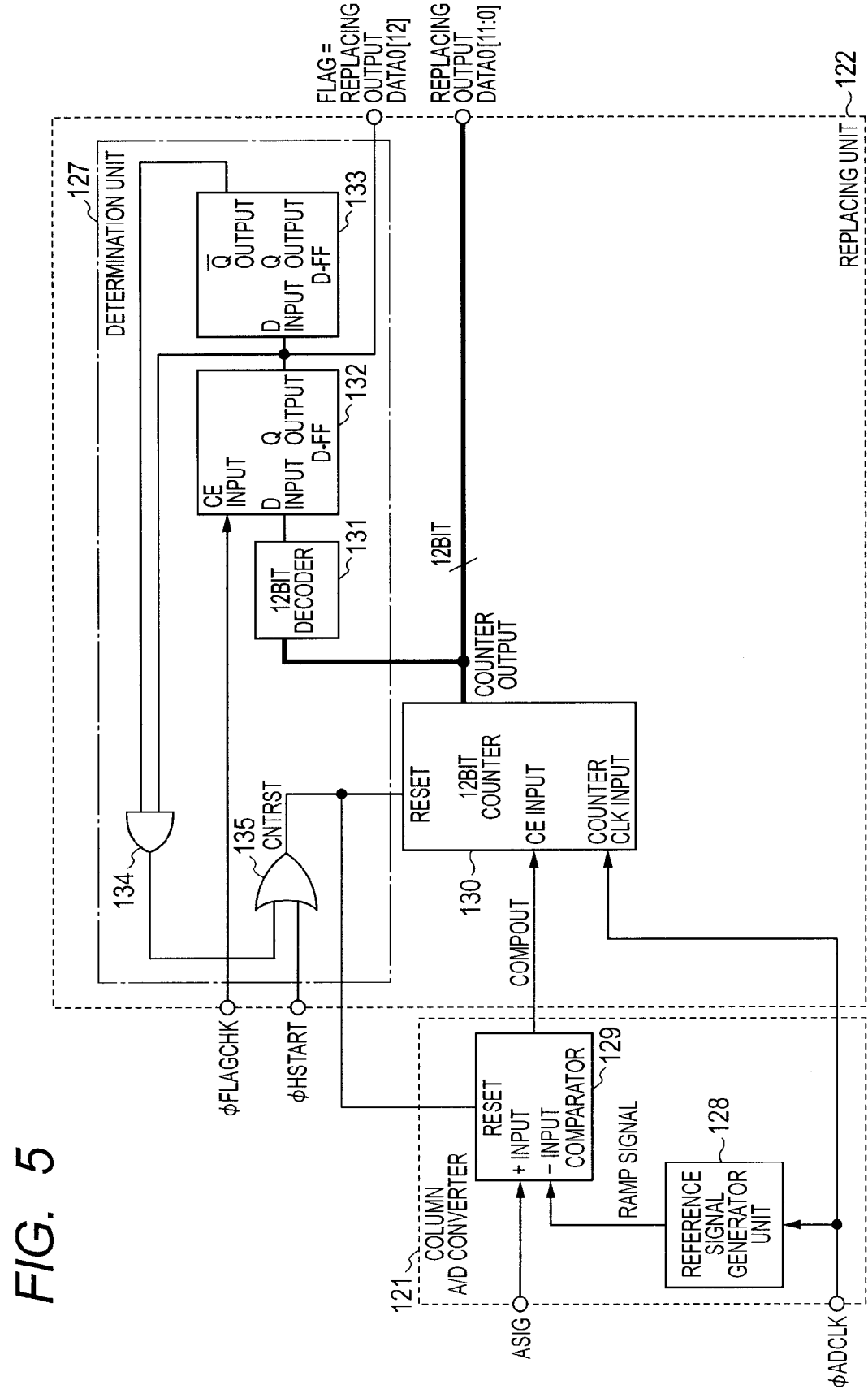
FIG. 5 is a diagram illustrating a column A/D converter and a replacing unit in a first embodiment.

Next, configurations of a column A/D converter 121 and a replacing unit 122 will be described with reference to FIG. 5. A column A/D converter 121 includes a reference signal generator unit 128 and a comparator 129. However, the reference signal generator unit 128 may be provided outside the column A/D converter 121 so as to supply a ramp signal RAMP in common to the respective columns. Here, the reference signal generator unit 128 generates a ramp waveform whose signal level successively increases in a signal φADCLK to form a ramp signal RAMP.

The comparator 129 compares an analog signal ASIG input to the column A/D converter 121 and the ramp signal RAMP generated in the reference signal generator unit 128. The comparator 129 is reset by a signal CNTRST, and provides a high-level output as an output COMPOUT. After the reset, the comparator output COMPOUT is maintained at a high level until the level of the ramp signal RAMP input to a negative terminal exceeds the level of the analog signal ASIG at a positive terminal. After the level of the ramp signal RAMP exceeding the level of the analog signal ASIG, the output COMPOUT transitions to a low level. Once the output COMPOUT has transitioned to a low level, the output COMPOUT is maintained at a low level regardless of the input signal until it is reset.

The replacing unit 122 includes a determination unit 127 and a 12-bit counter 130. An enable terminal CE of the 12-bit counter 130 for counting-up is connected to the comparator output COMPOUT. Accordingly, until the relationship in level difference between the level of the ramp signal RAMP and the level of the input analog signal ASIG is reversed and the comparator output COMPOUT transitions to a low level, the counter 130 counts up and outputs the value of the counting. The obtained counter output value corresponds to a value obtained as result of the input analog signal ASIG being subjected to A/D conversion. The counter output value forms the lower 12-bits (DATA0 [11:0]) in an output of the replacing unit 122.

The determination unit 127 determines whether to use the counter output as it is using the counting result of the counter 130, or reset the counter 130 again to perform count value replacement, and also controls a circuit necessary for the replacement. Also, the determination unit 127 outputs a flag signal FLAG so that the determination result can be used for controlling the following signal processing. The flag signal FLAG forms a higher one-bit (DATA0 [12]) in the output of the replacing unit 122. Here, first, an output of the counter, which has been obtained as a result of an analog signal ASIG read using an amplification factor of 8 as a first pixel signal being subjected to A/D conversion is decoded by a 12-bit decoder 131. The decoded value is input to a D-type flip-flop circuit (D-FF circuit) 132; however, the decoded value is reflected in an output of the D-FF circuit 132 only when the signal φFLAGCHK is input to the enable terminal (CE). Also, the output of the D-FF circuit 132 is conveyed as a flag signal FLAG and also connected to the following D-type flip-flop circuit (D-FF circuit) 133. Both the output of the D-FF circuit 132 and an inverted output of the D-FF circuit 133 are input to an AND circuit 134, and an output of the AND circuit 134 and a signal φHSTART are input to an OR circuit 135. An output of the OR circuit 135 forms a signal CNTRST, which is input to reset terminals of the counter 130 and the comparator 129.

If the output of the counter 130 reaches a given condition at a timing of the signal φFLAGCHK being input, the output of the 12-bit decoder 131 is reflected in the following unit, and used for resetting the counter 130 and the comparator 129 as the signal CNTRST. A signal obtained as a result of amplification by the amplification factor of 1, which is a second pixel signal input following the first pixel signal is subjected to A/D conversion, and the value of the counter 130 is updated. If the output of the counter 130 does not reach the given condition, the counter 130 and the comparator 129 are not reset. Accordingly, the second pixel signal input following the first pixel signal is not subjected to A/D conversion and the value of the counter 130 is not updated but remains at the value of the first pixel signal.

As described above, if digital data obtained as a result of A/D conversion of the first pixel signal reaches a certain condition, the digital data is replaced with digital data obtained as a result of A/D conversion of the second pixel signal, and if the digital data does not reach the certain condition, the digital data for the first pixel signal is not replaced but is used. Specific examples of the condition set in the decoder 131 include, for example, all the bits having a value of 1, and higher three bits having a value of 1. In the latter example, the count reaching 4095 is set as the condition, and in this case, the condition corresponding to the case where all the bits output by the 12-bit counter 130 have a value of 1. The decoder 131 corresponds to one 12-input AND circuit provided following the 12-bit counter 130.

The column A/D converter 121 is provided for each column of a plurality of pixels 101, and performs analog to digital conversion of the first and second pixel signals obtained as a result of amplification in the column amplifier 102 and subjected to noise reduction in the noise reduction unit 120. The replacing unit 122 is provided for each column of a plurality of pixels 101, and if the first pixel signal converted by the column A/D converter 121 has a value smaller than a threshold (for example, 4095), the replacing unit 122 selects the first pixel signal converted by the column A/D converter 121. Also, if the first pixel signal converted by the column A/D converter 121 has a value equal to or larger than the threshold (for example, 4095), the replacing unit 122 selects the second pixel signal converted by the column A/D converter 121. The horizontal scanning unit 104 successively selects the first pixel signal or the second pixel signal for each column, which has been selected by the replacing unit 122. The output of the replacing unit 122 for each column is successively selected by the horizontal scanning unit 104 and read out to the following correcting unit 124. Although the description has been given in terms of the case where determination is made based on whether the value is smaller than, or equal to or larger than a threshold, the same may apply to the case where determination is made based on whether the value is no more than or more than a threshold.

Figure 6:
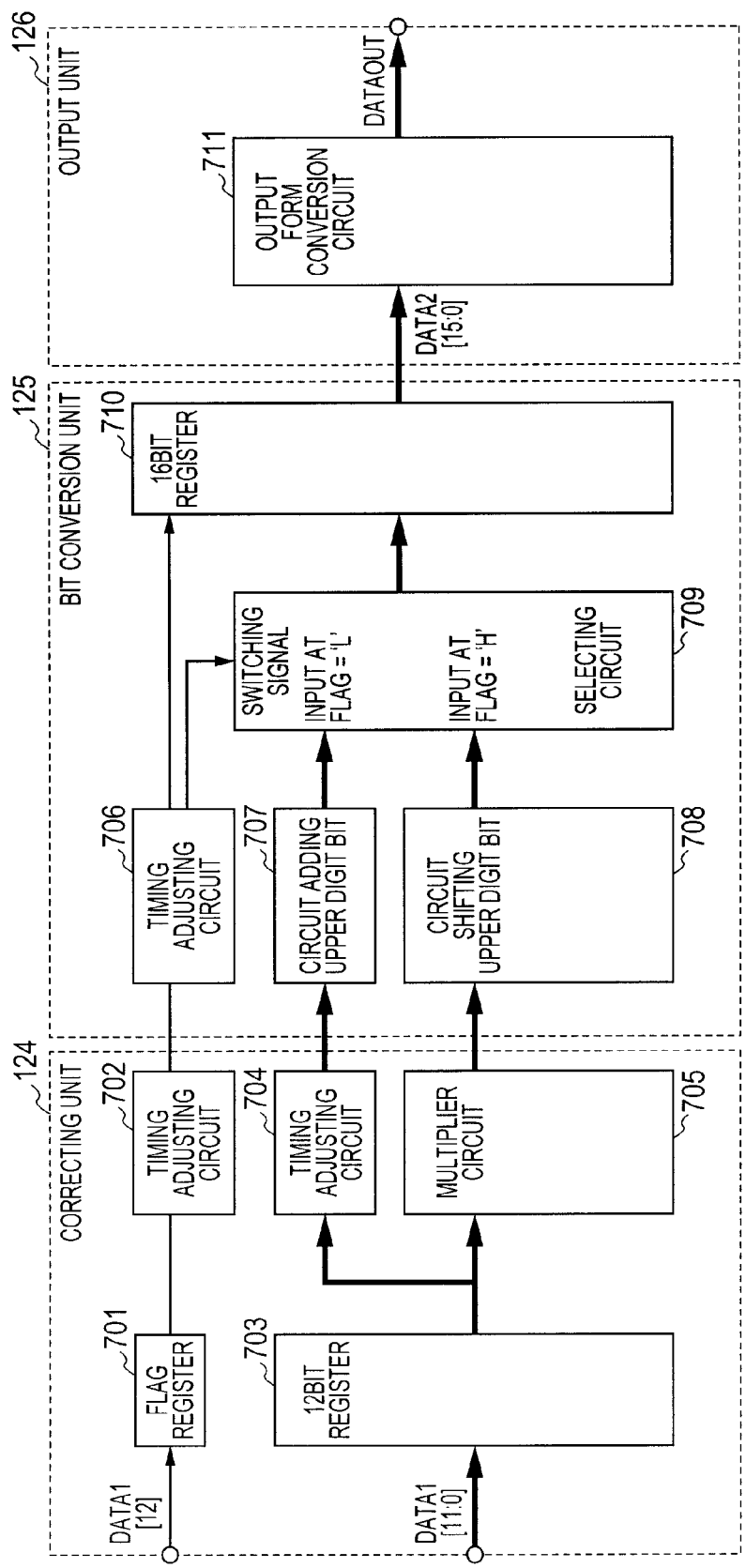
FIG. 6 is a diagram illustrating a correcting unit, a bit converting unit and an output unit in a first embodiment.

FIG. 6 illustrates configurations of a correcting unit 124, a bit converting unit 125 and an output unit 126. The column amplifiers 102 have errors such as amplification factor variation depending on the solid-state imaging device 1, amplification factor variation among the columns in the solid-state imaging device 1, and variation of the ratio between different amplification factors. The correcting unit 124 corrects such errors. In the correcting unit 124, a register 701 temporarily stores a flag signal input as data DATA1 [12], and a timing adjusting circuit 702 adjusts the timing of the value of the register 701 to the timing of corresponding image data when the value of the register 701 is used in the following unit. A register 703 temporarily stores 12-bit image data subsequent to replacement, which is input to the correcting unit 124 as data DATA1 [11:0]. An output of the register 703 is divided into two routes and different types of processing are performed on the same signals simultaneously. A timing adjusting circuit 704 adjusts the timing of the relevant route to the timing of the route of a multiplier circuit 705. The multiplier circuit 705 is a computing circuit including, e.g., a multiplier, which is a correcting circuit that performs computation using a value read from a ROM as a correction coefficient by means of, e.g., an external microprocessor and communication device (not illustrated). Although precise amplification factor correction requires a large scale of computation, the need for providing a correction processing circuit for each column is eliminated by providing a correction processing circuit at a position following the horizontal scanning unit 104 to perform processing after the signals are read by the horizontal scanning unit 104, enabling suppression of the circuit size.

In the bit converting unit 125, a timing adjusting circuit 706 temporarily stores a flag signal conveyed from the correcting unit 124, and an output of timing adjusting circuit 706 is sent to a selection circuit 709 and a 16-bit register 710 after timing adjustment. A higher-order bit adding circuit 707 adds three bits to higher digits of the 12-bit image data conveyed from the timing adjusting circuit 704 of the correcting unit 124. Consequently, the level of the data is ⅛ of the full scale. A higher-order bit shifting circuit 708 adds three bits to higher digits of the 12-bit image data conveyed from the multiplier circuit 705 of the correcting unit 124 and shifts the data by three bits to the higher-order bit side. Consequently, the level of the data relative to the full scale is maintained. A selection circuit 709 switches between the image data from the higher-order bit adding circuit 707 and the image data from the higher-order bit shifting circuit 708 according to the flag signal from the timing adjusting circuit 706. A 16-bit register 710 temporarily stores the selected 15-bit image data and the 1-bit flag together. Whether the image data is a first pixel signal component or a second pixel signal component is determined according to the flag. As a result of the determination, the selection circuit 709 selects an output of the higher-order bit adding circuit 707 for the digital signal component derived from the first pixel signal, while selecting an output of higher-order bit shifting circuit 708 for a digital signal component derived from the second pixel signal. As a result, in the selected signals, a component derived from the second pixel signal obtained as a result of amplification by an amplification factor of q (1) is converted so as to be multiplied by p/q (8) relative to a component derived from the first pixel signal obtained as a result of amplification by an amplification factor of (8).

In the output unit 126, an output format conversion circuit 711 converts the 16-bit data (15-bit image data+1-bit flag) DATA2 [15:0] from the converting unit 125 into a format for conveying the data to a system outside the solid-state imaging device 1 as an output DATAOUT. For example, the output format conversion circuit 711 is a circuit that makes the output be a low-voltage differential output in order to reduce external noise emission, and multiplexes and serializes the output into a number of signal pair lines, the number being smaller than the bit count, in order to convey the output via a fewer number of lines. It has been assumed that the output format conversion circuit 711 outputs 16-bit data; however, the output may be 15-bit data, which includes image data only, if the flag signal from the timing adjusting circuit 706 is not needed in the process after the output from the solid-state imaging device 1.

Figure 7:
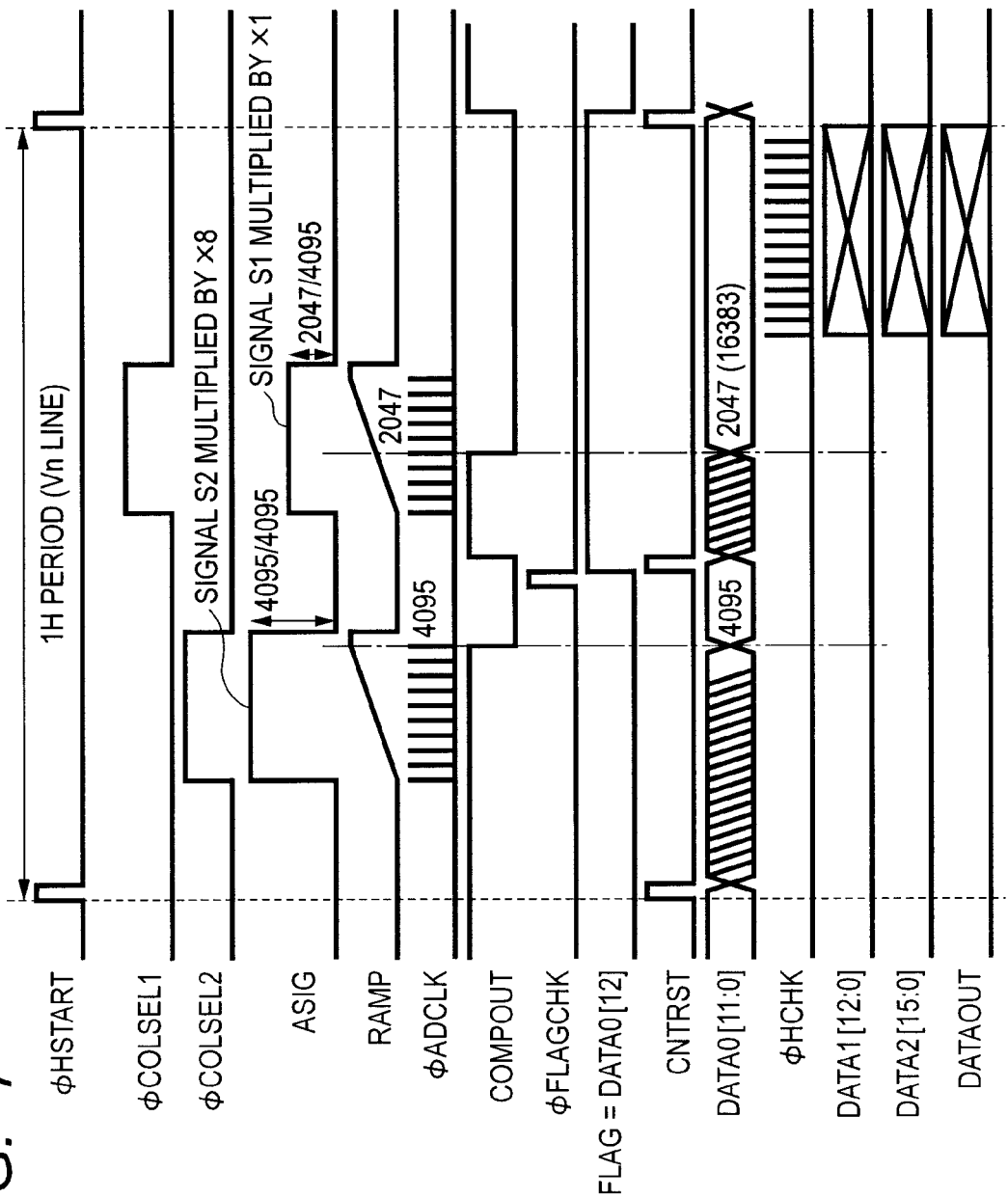
FIG. 7 is a diagram illustrating an operation in a first embodiment.
Figure 8:
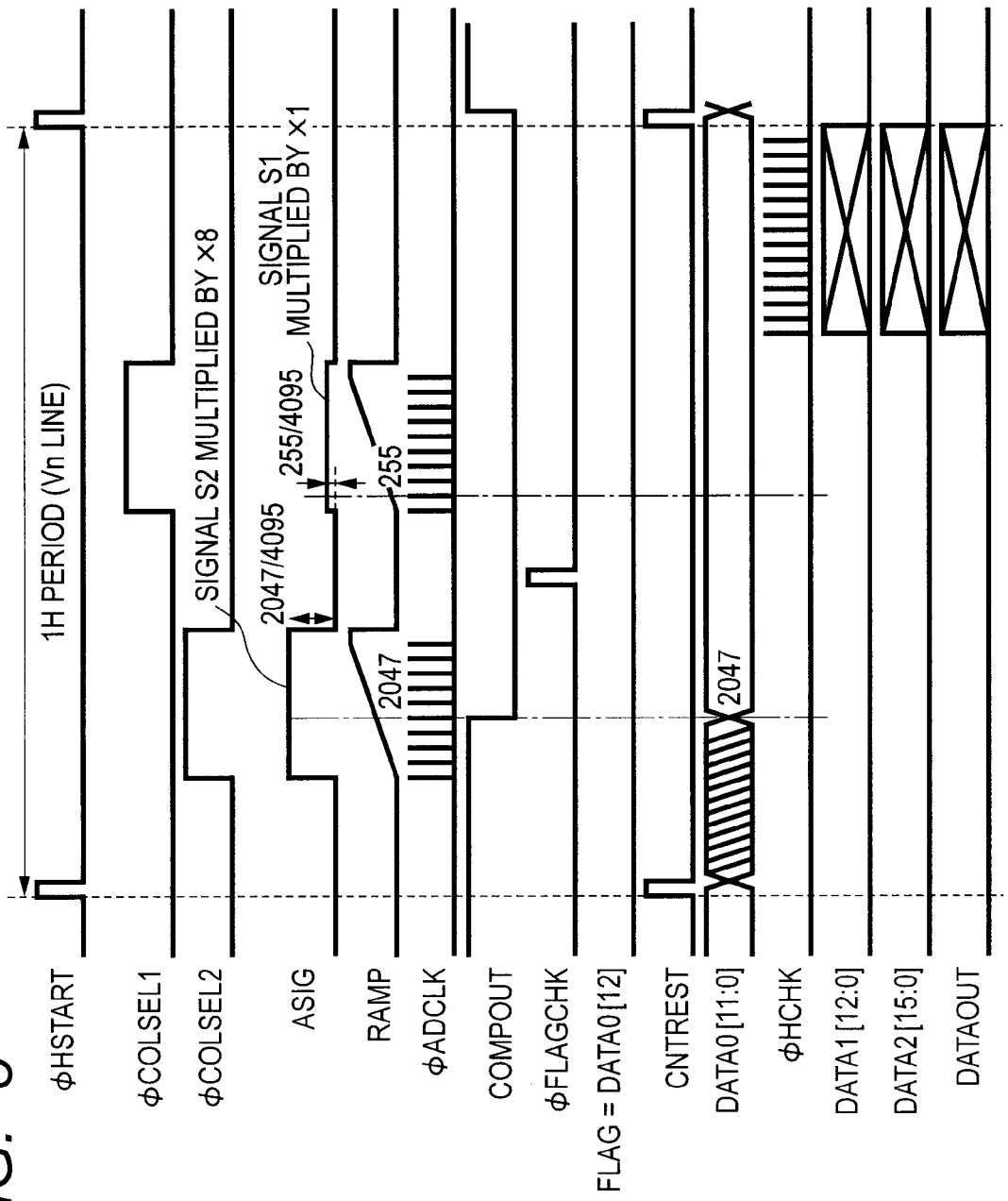
FIG. 8 is a diagram illustrating an operation in a first embodiment.

A method for driving the solid-state imaging device 1 will be described in terms of the process from the column A/D converter 121 to the output unit 126 with reference to FIGS. 7 and 8 together with FIGS. 5 and 6. FIGS. 7 and 8 illustrate differences in operation between the cases where the flag signal FLAG in a second pixel signal period is at a high level and at a low level according to the result of the replacing unit 122's determination according to the level of the image signal ASIG. In FIGS. 7 and 8, one horizontal scanning (1H) period indicates a period between start pulses φHSTART from the horizontal scanning unit 104. Here, signals of from an n-th line Vn to an n+1-th line Vn+1 in the vertical scanning circuit 103 are indicated. The signal φHCLK provides scanning clocks from the horizontal scanning unit 104. The signal φCOLSEL2 indicates a period for reading a first pixel signal derived by amplification by an amplification factor of 8 from the noise reduction unit 120, and the signal φCOLSEL1 indicates a period for reading a second pixel signal derived by amplification by an amplification factor of 1 from the noise reduction unit 120.

Also, the analog signal ASIG is an analog signal input to the column A/D converter 121, and a ramp signal RAMP is a signal for comparison, which is generated by the reference signal generator unit 128 for A/D conversion. Also, the output COMPOUT is a result of comparison of the two signals by the comparator 129. A signal φADCLK provides clocks used in, e.g., the reference signal generator unit 128 and the counter 130 for A/D conversion. The trigger signal φFLAGCHK provides a timing for replacement determination, and the flag signal FLAG is a flag, which is an output of the determination in the determination unit 127. The reset signal CNTRST is used for resetting the counter 130 and the comparator 129, and the 12-bit data DATA0 [11:0] is lower 12-bit data of an output of the replacing unit 122. The signal φHCLK provides clocks from the horizontal scanning unit 104, and the data DATA1 [12:0] are sets of an image signal and a flag signal sequentially read from the respective columns to be input to the correcting unit 124. Also, the data DATA2 [15:0] is an output of the bit converting unit 125, and the data DATAOUT is an output of the output unit 126.

In one horizontal scanning period, a period before the respective columns are sequentially selected and horizontal scanning is performed is referred to as a blanking period. During this blanking period, as described above, a signal is read out to the noise reduction unit 120 from the pixel unit 10 twice through amplification with different amplification factors in the column amplifier 102. Furthermore, during the same blanking period, first, during the signal φCOLSEL2 being at a high level, an analog signal ASIG corresponding to a first pixel signal derived by amplification by an amplification factor of 8 is read from the noise reduction unit 120, and the analog signal ASIG is input to the comparator 129. Here, the analog signal ASIG is compared with the ramp signal RAMP in the reference signal generator unit 128 using a signal φADCLK as clocks. The output COMPOUT, which is an output of the comparison, transitions to a low level when the level of the ramp signal RAMP is lower than the level of the analog signal ASIG, and transitions to a high level when the level of the ramp signal RAMP is higher than the level of the analog signal ASIG.

In FIG. 7, until the count of the signal φADCLK reaches 4095 (in decimal number), which is the maximum value of 12 bits, the level of the ramp signal RAMP remains lower than the level of the signal ASIG. Accordingly, the output COMPOUT is not inverted until this timing, and the 12-bit counter 130 outputs a maximum value of 4095 as a count value. In the present embodiment, the 12-bit decoder 131 is set to provide a high-level output when the count reaches 4095 or more, and at this point of time, the output transitions to a high level. Accordingly, the flag signal FLAG transitions to a high level upon input of the signal φFLAGCHK. Also, the comparator 129 and the counter 130 are reset in response to the signal CNTRST. Consequently, the count value DATA0 [11:0], which is temporarily 4095 in decimal number, returns to an initial value again and subjected to counting-up.

Next, during a period in which the signal φCOLSEL1 is at a high level, an analog signal ASIG corresponding to the second pixel signal derived by amplification by the amplification factor of 1 is read from the noise reduction unit 120, and the signal ASIG is input to the comparator 129 where the signal ASIG is compared with the ramp signal RAMP again.

In the second read, at a stage that the count of the signal φADCLK reaches 2047, the level of the ramp signal RAMP exceeds the level of the analog signal ASIG, and the output COMPOUT is inverted. As a result, the 12-bit counter 130 outputs a count value of 2047. Consequently, the output of the column on the illustrated n-th line Vn is determined as DATA0 [11:0]=2047 and FLAG=DATA0[12]=1.

According to clocks φHCLK from the horizontal scanning unit 104, output values determined as described above for the respective columns are sent to the correcting unit 124 onwards and subjected to pipeline processing. The data DATA1 [12:0] input to the correcting unit 124 are subjected to correction of errors caused by, e.g., the column amplifier 102 as described above in terms of the signals including the relevant flag. Also, the bit converting unit 125 converts the 13-bit signal into a 16-bit output DATA2 [15:0], and subsequently, the output unit 126 converts the output into a differential output, and outputs the differential output from the solid-state imaging device 1 as an output DATAOUT.

Figure 9A:
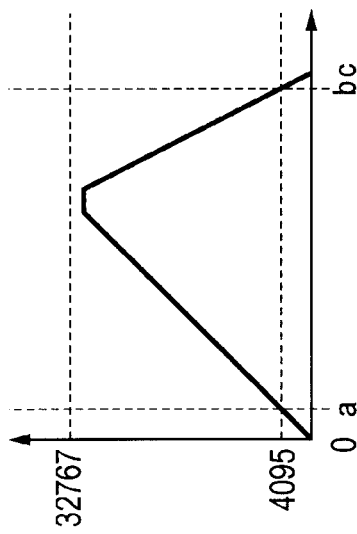
FIGS. 9A, 9B, 9C, 9D and 9E are diagrams each illustrating processing in a correcting unit and a bit converting unit in a first embodiment.
Figure 9B:
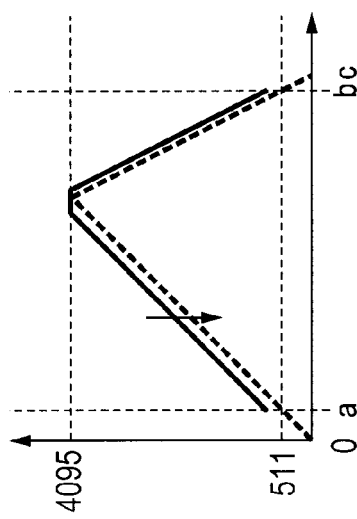
Figure 9D:
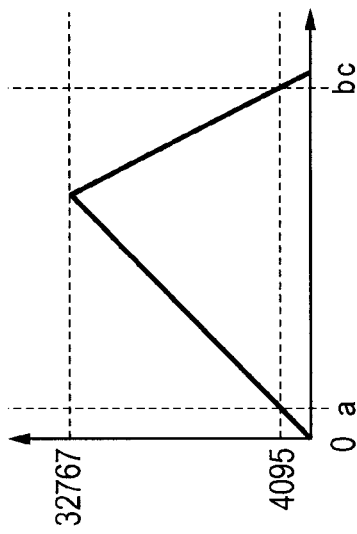
Figure 9C:
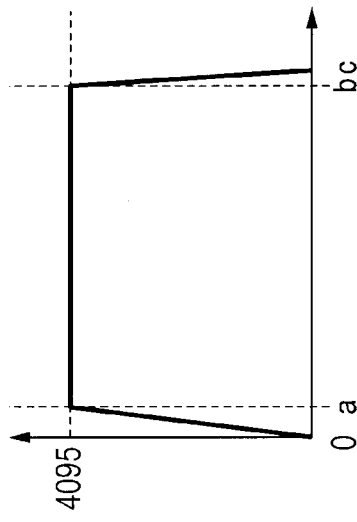
Figure 9E:
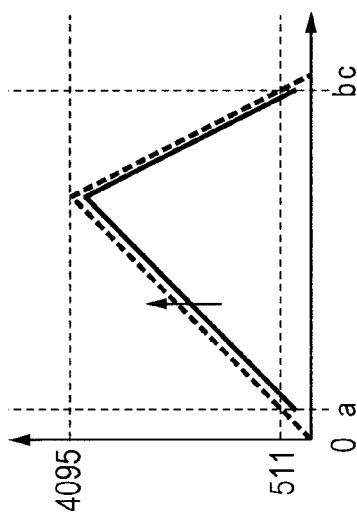

Here, processing performed in the correcting unit 124 and the bit converting unit 125 will be described with reference to the schematic diagram in FIGS. 9A to 9E. FIG. 9A schematically illustrates signals read from pixels 101, which have been amplified by an amplification factor of 8, and the abscissa axis represents positions in a row where columns a, b and c are located. Here, the signals read from the pixel increase from 0 to 4095, which is the maximum value of 12 bits, from a column 0 to the column a, and the signals are saturated from column a to column b because they have a value of 4095 or more, and decrease from 4095 toward 0 from column b to column c. FIGS. 9B and 9C each schematically illustrate signals read from the pixels 101, which have been amplified by an amplification factor of 1, and as in FIG. 9A, the abscissa axis represents positions of columns a, b and c. In theory, the values in columns a and b should be ((4095+1)/8)−1=511 as indicated by a dotted line in FIGS. 9B and 9C because the signals are the same signals with a difference of eight times in amplification factor therebetween. However, in reality, because of, e.g., an amplification factor error in the column amplifier 102, the values of columns a and b have errors as can be seen from the solid line. FIG. 9B indicates the case where larger values are obtained, and FIG. 9C indicates the case where smaller values are obtained. Accordingly, in the case illustrated in FIG. 9B or 9C, the correcting unit 124 multiplies the signals by a correction factor so that the values in columns a and b become 511, thereby performing correction to make the values in columns a and b correspond to the values in FIG. 9A. Also, the bit converting unit 125 performs processing on each signal in FIG. 9A to simply add three bits thereto as higher order bits and remains the value of the signal as it is, and also performs processing on each signal in FIG. 9B or 9C to add three bits thereto and perform a 3-bit shift toward the higher-order side. As a result of the bit shift, the signals in FIG. 9B or 9C have been converted into the values multiplied by 8. In reality, at the stage of the replacing unit 122 before the correction, with the value of 4095 as a threshold, the signals in FIG. 9A for the ranges from columns 0 to a and from columns b to c and the signals in FIG. 9B or 9C for the range from columns a to b are combined so that they can be distinguished from each other according to the flags. The data subjected to the correction and bit conversion have values illustrated in FIG. 9D in the case of the combination of FIGS. 9A and 9B, and have values illustrated in FIG. 9E in the case of the combination of FIGS. 9A and 9C. In FIG. 9D, the maximum value is saturated; however, no gray-level difference occurs at columns a and b which are joints in the combination of the images in FIGS. 9A and 9B, enabling suppression of image quality deterioration.

Here, the case where signals derived by amplification by an amplification factor of 1 are read first will be considered with reference to FIG. 10. FIG. 10A schematically illustrates signals read from pixels, which have been amplified by an amplification factor of 1, and the abscissa axis represents positions in a row where columns a, b and c are located. Here, the signals read from the pixel 101 increase from 0 to 4095, which is the maximum value of 12 bits, from a column 0, and have a value of 511 in the column a. Also, after reaching 4095, the signals decrease 4095 toward 0 up to column c, and the signal in column b has a value of 511. FIGS. 10B and 10C each schematically illustrate signals read from the pixels 101, which have been amplified by an amplification factor of 8, and as in FIG. 10A, the abscissa axis represents positions of columns a, b and c. In theory, the values in columns a and b should be $((511+1)/8)-1=4095$ as indicated by a dotted line in FIGS. 10B and 10C because the signals are the same signals with a difference of ⅛ times in amplification factor therebetween. However, in reality, because of, e.g., an amplification factor error in the column amplifier 102, the values of columns a and b have errors as can be seen from the solid line. FIG. 10B indicates the case where smaller values are obtained, and FIG. 10C indicates the case where larger values are obtained. Accordingly, in the case illustrated in FIG. 10B or 10B, the correcting unit 124 multiplies the signals by a correction factor so that the values in columns a and b become 511, thereby performing correction to make the values in columns a and b correspond to the values in FIG. 10A. Also, the bit converting unit 125 performs processing on each signal in FIG. 10A to add three bits thereto and perform a 3-bit shift toward the higher-order side. The bit converting unit 125 performs processing on each signal in FIG. 10B or 10C to simply add three bits thereto as higher order bits and remains the value of the signal as it is. As a result of the bit shift, the signals in FIG. 10A has been converted into the values multiplied by 8. The data subjected to the correction and bit conversion have values illustrated in FIG. 10D in the case of the combination of FIGS. 10A and 10B, and have values illustrated in FIG. 10E in the case of the combination of FIGS. 10A and 10C. However, in FIG. 10B, data from columns 0 to a do not exceed 4095 and thus, the data indicated by the solid line can be corrected to be data indicated by the dotted line. However, in FIG. 10C, since data from columns 0 to a exceeds 4095, even though the data indicated by the solid line is corrected to be data indicated by the dotted line, a part of the data, which has a saturated value of 4095, cannot be corrected. Accordingly, image quality deterioration in causing unnatural joints between images occurs around columns a and b in FIG. 10E. For such reason, in the present embodiment, a first pixel signal and a second pixel signal are read and subjected to column A/D conversion, and determination is made using the first pixel signal and then one of the first pixel signal and the second pixel signal is selected. Here, in the present embodiment, a signal read using a higher amplification factor is used for an image signal subjected to determination, enabling reduction of errors with a smaller number of components.

As illustrated in FIG. 6, the correcting unit 124 corrects relative errors between the first pixel signals and the second pixel signals for the first pixel signals or the second pixel signals selected by the horizontal scanning unit 104, and outputs the corrected signals to the bit converting unit 125. Upon receipt of the first pixel signals or the second pixel signals selected by the horizontal scanning unit 104 and corrected by the correcting unit 124, the bit converting unit 125 outputs pixel signals, which have been obtained as a result of multiplication by a first factor (for example, 1) and increasing the number of bits, for the first pixel signals. The bit converting unit 125 outputs pixel signals, which have been obtained as a result of multiplication by a second factor (p/q) that is different from the first factor and increasing the number of bits, for the second pixel signals. Here, p>q where, for example, p=8 and q=1. The replacing units 122 output flag signals FLAG each indicating which one of the first pixel signal and the second pixel signal has been selected to the bit converting unit 125. If the flag signal FLAG indicates selection of the first pixel signal, the bit converting unit 125 outputs the pixel signal obtained as a result of the first pixel signal being multiplied by the first factor and increasing the number of bits in the first pixel signal. If the flag signal FLAG indicates selection of the second pixel signal, the bit converting unit 125 outputs a pixel signal obtained as a result of the second pixel signal being multiplied by the second factor and increasing the number of bits in the second pixel signal.

In FIG. 8, at the stage that the count of the signal φADCLK reaches 1999 (in decimal number) in 12 bits, the level of the ramp signal RAMP exceeds the level of the analog signal ASIG, the output COMPOUT is inverted at the timing, and the 12-bit counter 130 outputs "1999" as a count value. In the present embodiment, the 12-bit decoder 131 is set so as to provide a high-level output when the count reaches 4095 or more, and accordingly, the output of the decoder 131 remains at a low level. Thus, the flag signal FLAG is maintained at a low level even though the signal φFLAGCHK is input. Accordingly, the comparator 129 and the counter 130 are not reset at this stage and no replacement is made. During a high-level period of the signal φCOLSEL1, the signal corresponding to the second pixel signal derived by amplification by the amplification factor of 1 is read from the noise reduction unit 120. Then, while the analog signal ASIG is input to the comparator 129, the ramp signal RAMP is also input thereto; however, the comparator 129 does not compare the two signals. In the second read, at the stage that the count of the signal φADCLK reaches 249, the level of the ramp signal RAMP exceeds the level of the analog signal ASIG, but the output COMPOUT remains at a low level.

Consequently, the output of the present column on the illustrated n-th line Vn can be determined to be DATA0 [11:0]=1999 or FLAG=DATA0 [12]=0. In this case, also, according to clocks φHCLK from the horizontal scanning unit 104, the determined output values from the respective columns are successively output to the correcting unit 124 as the data DATA1 [12:0], and subjected to pipeline processing, thereby being converted into 16-bit outputs DATA2 [15:0] in the bit converting unit 125. Subsequently, the output unit 126 converts the outputs into differential outputs and provides the outputs to the outside of the solid-state imaging device 1 as the outputs DATAOUT.

A point of the present embodiment lies in the fact that during the reading of image signals from the solid-state imaging device 1 in one horizontal scanning period, a plurality of pixel signals obtained by reading a signal by different amplification factors is read and one of the pixel signals is selected for each column. In other words, the column amplifiers 102, the column A/D converters 121 and the replacing units 122 perform processing on first pixel signals and second pixel signals during a period in which the horizontal scanning unit 104 selects and outputs pixel signals for one row. Another point of the present embodiment lies in the fact that the column A/D converters 121 and the replacing units 122 provided for the respective columns are used for the selections for the respective columns. Consequently, with time during which column A/D conversion of a signal with a small number of bits is performed twice, an output of a signal with precision corresponding to that of a signal with a large number of bits, which should require more time for A/D conversion, can be provided. It is known that column A/D conversion generally requires more time for conversion as the bit precision of data increases. For example, in the case of a method in which A/D conversion is performed in comparison with a simple ramped reference signal, conversion time eight times that required for 12-bit signal conversion is required to provide precision corresponding to that of a 15-bit signal. The present embodiment provides an advantage in that a signal is read twice with different amplification factors and 12-bit A/D conversion is performed twice, requiring reduction of A/D conversion time to ¼ while precision corresponding 15-bit conversion being provided. Also, since each same signal is merely read with two amplification factors predetermined on a row-by-row basis, there is no need for time for feeding signals for the preceding frame back to reflect the result in the present signals, and performing accumulation twice, enabling frame rate enhancement. Although it is necessary to read a pixel signal twice and perform A/D conversion, the resulting speed decrease can be considered to be small. Furthermore, the signals are read by horizontal scanning after selection of first pixel signals or second pixel signals for the respective columns, and accordingly, there is no need to provide a memory for frame combination outside the solid-state imaging device 1, enabling suppression of the circuit size. Also, there is no need to individually perform feedback control of amplification factors for the respective columns, and the column amplifiers 102 in the respective columns perform common operations, enabling simplification of the structure. As described above, a solid-state imaging device 1 enabling provision of an enhanced S/N ratio and expanded dynamic range of signals output therefrom with a small circuit size and a small operation speed decrease can be provided.

Furthermore, one of the first pixel signal and the second pixel signal, which have been subjected to A/D conversion by the A/D converter 121, is selected for each pixel, and the selected data is associated with identification information indicating whether the selected data is data derived from the first pixel signal or the second pixel signal. Consequently, even the selected signals can easily be distinguished as to whether the signal is derived from the first pixel signal or the second pixel signal, and image processing can selectively be performed in the following process, enabling sharing and thus simplification of the circuit.

Furthermore, in the present embodiment, the correcting unit 124 is provided following the horizontal scanning unit 104 that successively reads signals from the respective columns, to correct relative errors between the first pixel signals and the second pixel signals. Consequently, there is no need for providing a correction circuit, which has a large volume for performing complicated computations, for each column, enabling suppression of the circuit size.

Second Embodiment

In the first embodiment, in one horizontal scanning period, a same signal is read from a column amplifier 102 twice with different amplification factors, and the read signals are subjected to A/D conversion in a column A/D converter 121 and then subjected to selection in a replacing unit 122 provided for each column. A second embodiment of the present invention will be described in terms of an example in which in one horizontal scanning period, pixel signals amplified with different amplification factors are simultaneously read from two column amplifiers, respectively, and the two signals are subjected to A/D conversion and selection in one column A/D converter.

Figure 11:
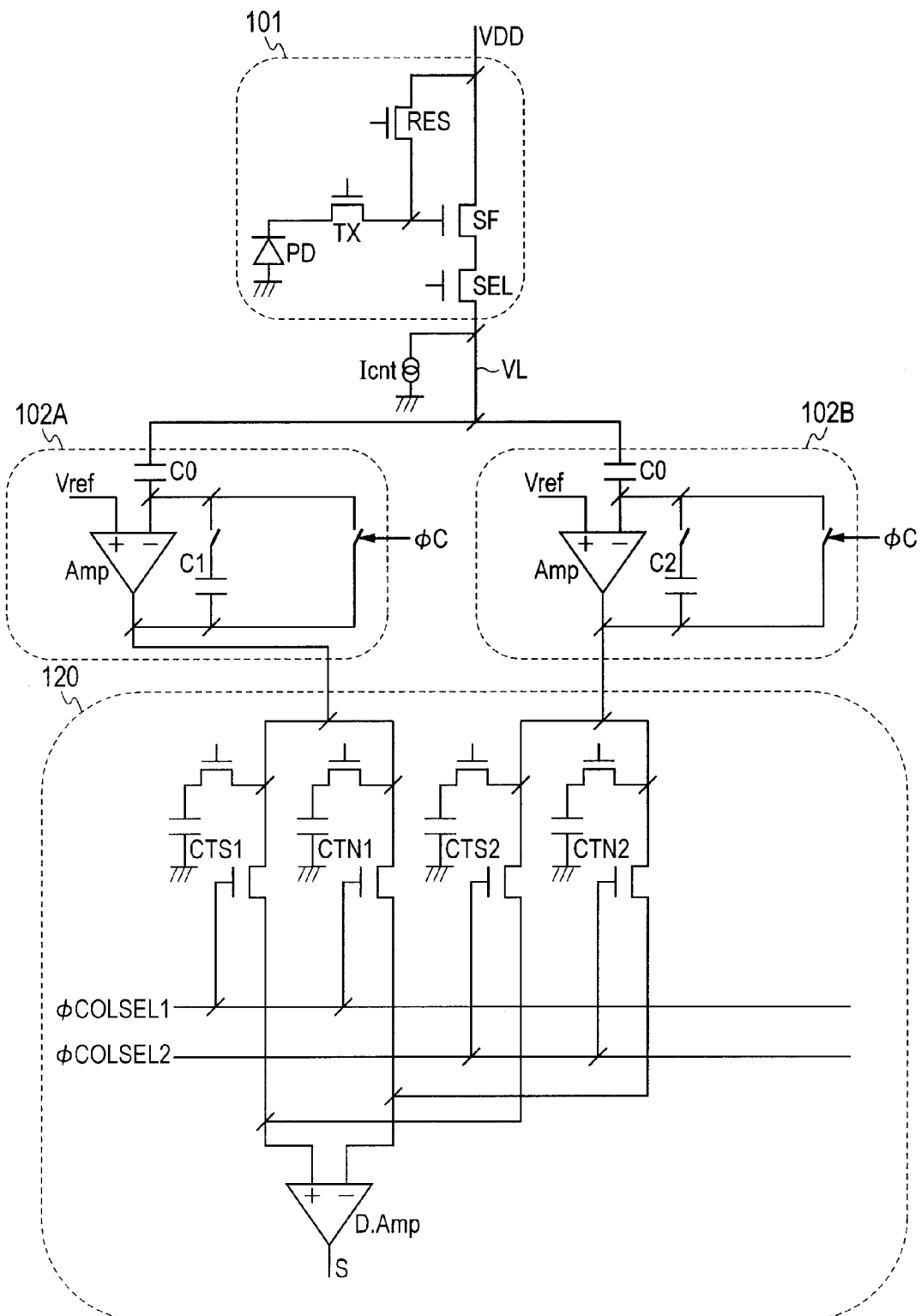
FIG. 11 is an equivalent circuit diagram in a second embodiment.

FIG. 11 is an equivalent circuit diagram of a solid-state imaging device 1 according to a second embodiment of the present invention. FIG. 11 provides a detailed illustration of configurations of column amplifiers 102A and 102B and a noise reduction unit 120 for one pixel 101. A feature of the present embodiment lies in providing two sets of a column amplifier 102A or 102B and a noise reduction unit 120 for each column. The pixel 101 is similar to that of the first embodiment (FIG. 3). Also, components in FIG. 11 having the same symbols as those in FIG. 3 are components equivalent to those in the first embodiment. The column amplifiers 102A and 102B are amplifiers provided for a same pixel column, which have different amplification factors, in place of the column amplifier 102 in the first embodiment. Here, it is assumed that the capacitance values of feedback capacitances C1 and C2 are 1 and ⅛ times the capacitance value of an input capacitance C0, respectively. In other words, in the present embodiment, two column amplifiers 102A and 102B with different amplification factors are provided. A signal amplified by the column amplifier 102A is selectively conveyed to and retained in a retention capacitance CTS1 or CTN1 in the noise reduction unit 120. Also, a signal amplified by the column amplifier 102B is selectively conveyed to and retained in a retention capacitance CTS2 or CTN2 in the noise reduction unit 120. The retention capacitances CTS1 and CTS2 retain a signal based on charge obtained as a result of photoelectric conversion by a photo diode PD, and the retention capacitances CTN1 and CTN2 retain a signal based on reset of a pixel output unit SF. Afterward, as in the first embodiment, the signals retained in the retention capacitances CTS1 and CTN1 are input to different input terminals of a differential amplifier D. Amp via switches that are brought into conduction via a signal φCOLSEL1. The signals retained by the retention capacitances CTS2 and CTN2 are input to different input terminals of a differential amplifier D. Amp via switches that are brought into conduction via a signal φCOLSEL2. The differential amplifier D. Amp outputs a difference between the signals retained by the retention capacitances CTS1 and CTN1, and a difference between the signals retained by the retention capacitances CTS2 and CTN2 in time series.

Figure 12:
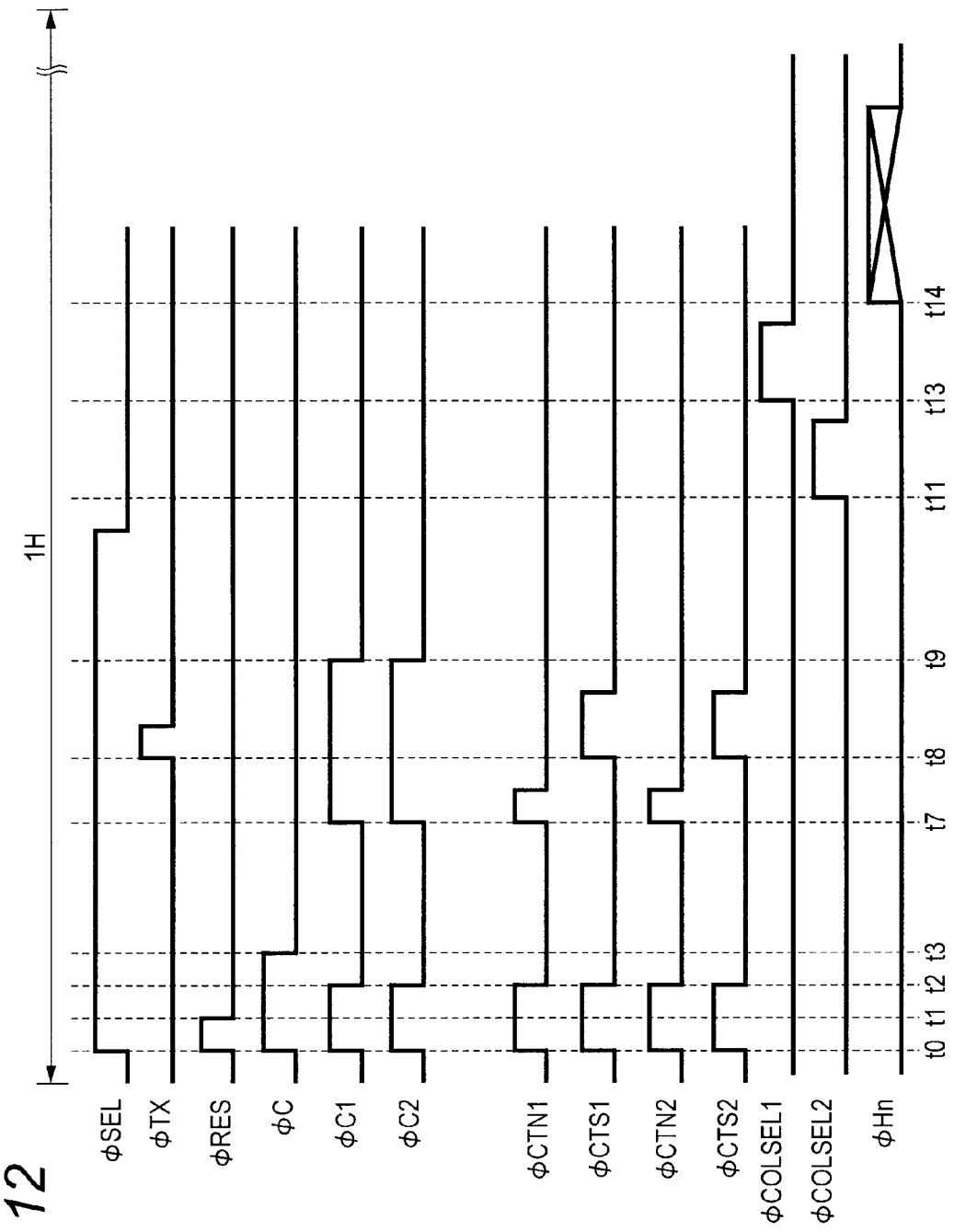
FIG. 12 is a diagram illustrating an operation in one horizontal scanning period in a second embodiment.

First, an operation of the pixel 101, the column amplifier 102A and 102B, and the noise reduction unit 120 illustrated in FIG. 11 in one horizontal scanning period will be described with reference to FIG. 12. It is assumed that the respective capacitance values of the feedback capacitances C1 and C2 are 1 and ⅛ times the capacitance value of the input capacitance C0. In other words, description will be given in terms of the case where one signal is amplified by amplification factors of 1 and 8. First, at a time t0, signals except signals φTX and φHn transition to a high level. When a signal φSEL transitions to a high level, the pixel selection unit SEL is brought into conduction, and thus, a source terminal of the pixel output unit SF and a constant current source Icnt are selectrically connected, forming a source follower circuit. Consequently, a signal exhibiting a level according to the potential of a gate terminal of the pixel output unit SF appears in a vertical signal line VL. At this timing, since a signal φRES is at a high level, a reset unit RES is turned on, and a signal exhibiting a level according to a state in which the gate terminal of the pixel output unit SF has been reset appears in the vertical signal line VL. Also, as a result of signals φC, φC1 and φC2 transitioning to a high level, respectively, an inverting input terminal and an output terminal of an operational amplifier Amp is short-circuited and the feedback capacitances C1 and C2 are. As a result of virtual grounding of the operational amplifier Amp, the respective opposite terminals of the feedback capacitances C1 and C2 can be regarded as having the same potential as the potential of a power supply Vref. Since signals φCTN1, φCTS1, φCTN2 and φCTS2 are at a high level, the retention capacitances CTN1, CTS1, CTN2 and CTS2 are reset by an output of the operational amplifier Amp.

Operations from times t1 to t3 are similar to those in the first embodiment. At a time t7, the signals φCTN1 and φCTN2 exhibit a high level in the form of a pulse, and when the signals φCTN1 and φCTN2 transition to a low level, signals containing respective offset components caused by the column amplifiers 102A and 102B are retained in the retention capacitances CTN1 and CTN2. When the signal φTX transitions to a high level at a time t8, the charge accumulated in the photo diode PD is transferred to the gate terminal of the pixel output unit SF. From the time t8, the signals φCTS1 and φCTS2 exhibit a high level in the form of a pulse, the signal subjected to one-fold amplification in the column amplifier 102A is retained in the retention capacitance CTS1 as a result of the signal φCTS1 transitioning to a low level. Also, the signal subjected to 8-fold amplification in the column amplifier 102B is retained in the retention capacitance CTS2 as a result of the signal φCTS2 transitioning to a low level.

At a time t9, the signals φC1 and φC2 transition to a low level. Subsequently, as a result of the signal φSEL transitioning to a low level, the pixel selection unit SEL is turned off, and the pixel 101 is released from the selected state. When the signal φCOLSEL2 transitions to a high level at a time t11, the signals retained in the retention capacitances CTS2 and CTN2 are output to the differential amplifier D. Amp. The differential amplifier D. Amp outputs a differential signal between the signals retained by the retention capacitances CTS2 and CTN2 to the column A/D converter 121 as a first pixel signal. Subsequently, when the signal φCOLSEL1 transitions to a high level at a time t13, the signals retained in the retention capacitances CTS1 and CTN1 are output to the differential amplifier D. Amp. The differential amplifier D. Amp outputs a differential signal between the signals retained by the retention capacitances CTS1 and CTN1 to the column A/D converter 121 as a second pixel signal. The process in the column A/D converter 121 onwards is similar to that illustrated in FIGS. 5 and 6 in the first embodiment. The first pixel signal and the second pixel signal are subjected to A/D conversion in the column A/D converter 121, and one of the first pixel signal and the second pixel signal is selected in the corresponding replacing unit 122 as an output signal for the relevant column. Subsequently, at a time t14, data selected for the respective columns are successively read out to the following correcting unit 124 via drive pulses φ HCLK from the horizontal scanning unit 104.

As described above, the first column amplifier 102B outputs a first pixel signal derived by amplification by an amplification factor of p (for example, 8). The second column amplifier 102A outputs a second pixel signal derived by amplification by an amplification factor of q (for example, 1). Consequently, with time during which column A/D conversion of a signal with a small number of bits is performed twice, an output of a signal with precision corresponding to that of a signal with a large number of bits, which should require more time for A/D conversion, can be provided. The present embodiment provides an advantage in that a signal is read twice with different amplification factors and 12-bit A/D conversion is performed twice, requiring reduction of A/D conversion time to ¼ while precision corresponding to that of 15-bit conversion being provided. Since a signal from a same pixel is merely read with two amplification factors predetermined on a row-by-row basis, there is no need for time for feeding signals for the preceding frame back to reflect the result in the present signals, and performing accumulation twice, enabling frame rate enhancement. Furthermore, the signals are read by horizontal scanning after selection of first pixel signals or second pixel signals for the respective columns, and accordingly, there is no need to provide a memory for frame combination outside the solid-state imaging device 1, enabling suppression of the circuit size. Also, there is no need to individually perform feedback control of amplification factors for the respective columns, and the column amplifiers 102A and 102B in the respective columns perform common operations, enabling simplification of the structure.

According to the first and second embodiments, neither the time lag equivalent to one frame occurs nor the increase in circuit size occur in a memory unit, and furthermore, the operation speed decrease is prevented, enabling provision of a solid-state imaging device 1 with an enhanced S/N ratio and an expanded dynamic range of signals output therefrom.

Third Embodiment

Figure 13:
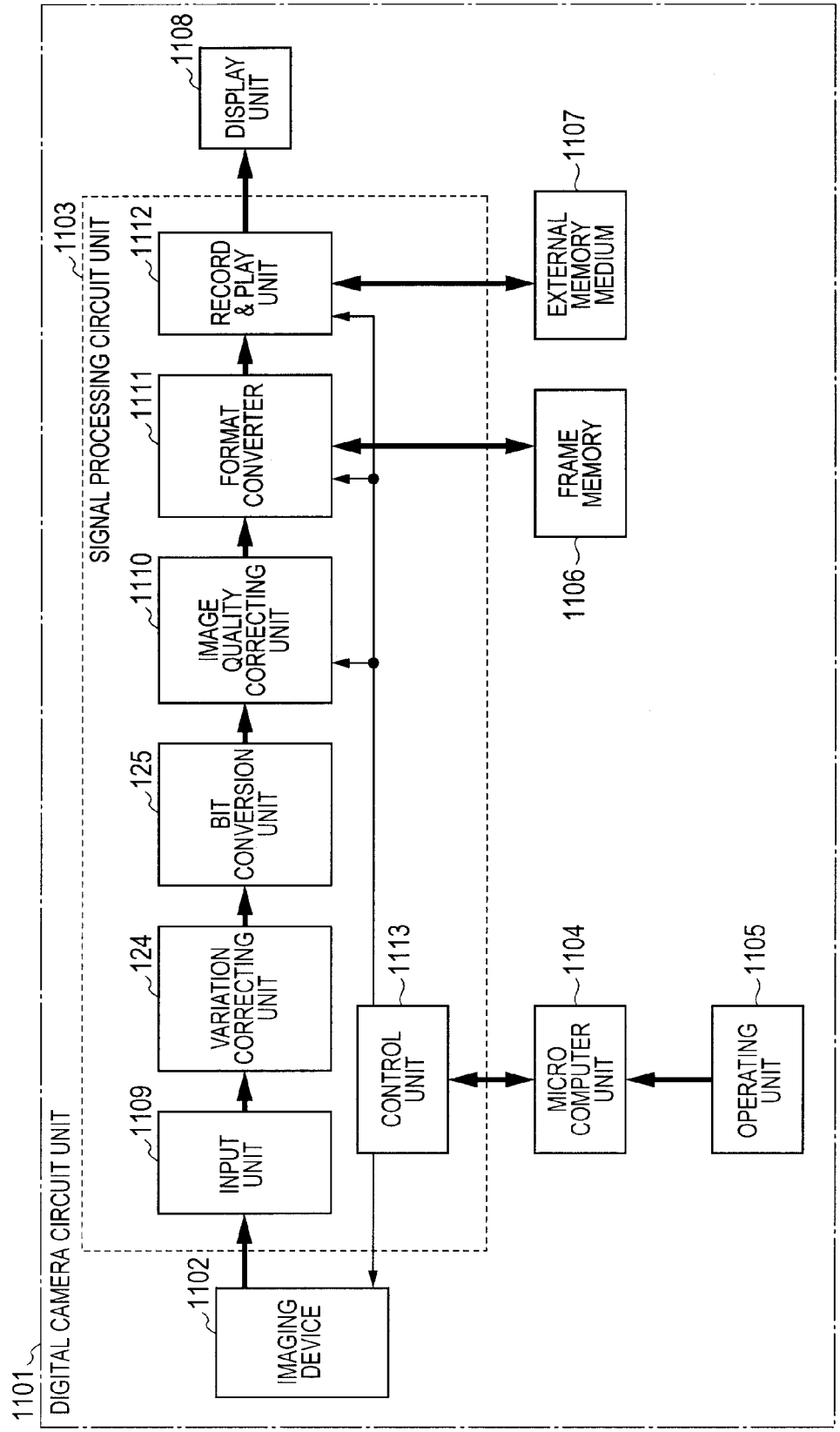
FIG. 13 is a configuration diagram of an imaging apparatus according to a third embodiment.

A third embodiment of the present invention will be described in terms of an example in which a first step of selecting one of a first pixel signal and a second pixel signal for each column and a second step of successively reading the signals in the respective columns by means of horizontal scanning are performed in a solid-state imaging device. A third step of increasing the number of bits in the respective signals and a fourth step of performing corrections according to the selection are performed outside the solid-state imaging device. FIG. 13 illustrates a digital camera, which is an example of an imaging apparatus according to the present embodiment.

FIG. 13 illustrates a digital camera circuit (imaging apparatus) 1101. In the circuit 1101, a solid-state imaging device 1102 according to the first embodiment is provided and a signal processing circuit 1103, which includes, e.g., a circuit board, and a logic IC, such as an application-specific integrated circuit (ASIC) or a field programmable logic array (FPGA), performs digital processing. A microprocessor unit 1104 receives an input from an operation unit 1105 and outputs a control signal to a control unit 1103 in the signal processing circuit 1103 to determine a system operation. A frame memory 1106 temporarily stores an image necessary for image processing, such as format conversion, in the signal processing circuit 1103. An external memory medium 1107, such as a memory card or a hard disk, stores a captured image. A display unit 1108, which includes liquid crystals or EL elements, displays a captured image or various information. An input unit 1109 receives a digital signal from the solid-state imaging device 1102 and acts as an interface (IF) with the following circuit. More specifically, for example, upon receipt of serialized low-amplification differential signals from the solid-state imaging device 1102, the signal processing circuit 1103 deserializes the signals and converts the low-amplification differential signals into single-end signals with an internally-used signal amplitude. A variation correcting unit 124 is a unit that performs the fourth step of performing corrections according to selection, and a bit converting unit 125 performs the third step of increasing the number of bits. The variation correcting unit 124 and the bit converting unit 125 are the same as the correcting unit 124 and the bit converting unit 125 described in the first embodiment with reference to FIG. 6. Also, circuit operations of the variation correcting unit 124 and the bit converting unit 125 are similar to the operations described with reference to FIGS. 7 to 10. The bit converting unit 125 combines 15-bit data and a 1-bit flag signal and outputs the 16-bit signal to a following image quality correcting unit 1110. Consequently, even though first and second pixel signals are mixed in a same data sequence after bit conversion, the image quality correcting unit 1110 can distinguish between signals derived from the first pixels signal and the second pixel signals. For example, the image quality correcting unit 1110 can switch the factors and operation types for successive processing such as filtering using line memories and registers with reference to the flags. A format conversion unit 1111 performs conversion into, e.g., an image compression format such as JPEG. Here, in the case where it is necessary to perform format conversion while distinguishing between the signals derived from the first pixel signals and the second pixel signals, since the bit converting unit 125 outputs a 16-bit signal including 15-bit data and a 1-bit flag signal to the following unit, switching can be made with reference to the flag. A recording and reproducing unit 1112 records an image after format conversion in the external memory medium 1107 and displays an image in the external memory medium 1107 on the display unit 1108. A control unit 1113 controls the operations of the respective units in the signal processing circuit 1103 and the operation of the solid-state imaging device 1102 in response to instructions from the microprocessor unit 1104.

Figure 14:
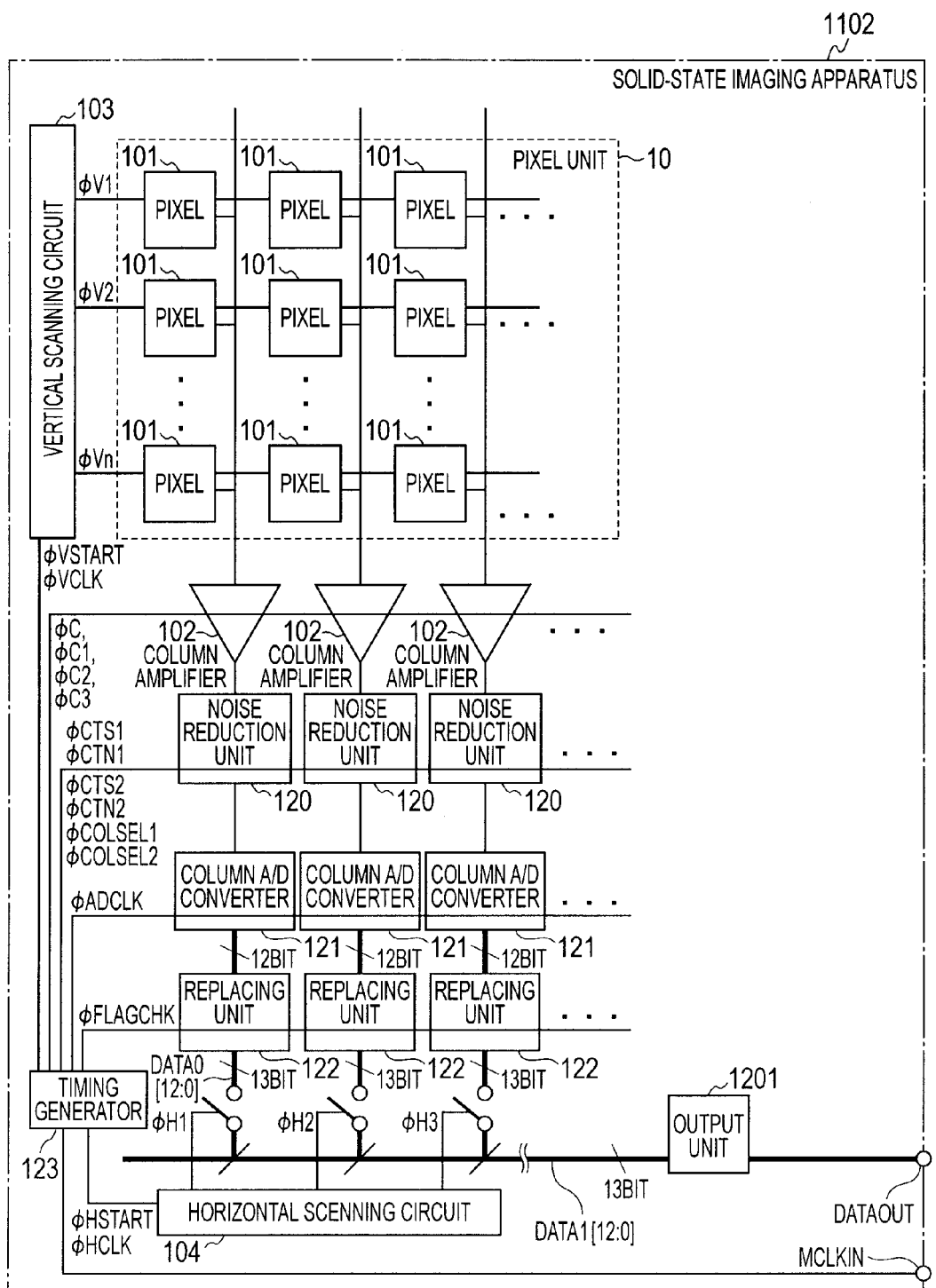
FIG. 14 is a configuration diagram of a solid-state imaging device according to a third embodiment.

FIG. 14 illustrates an example of the solid-state imaging device according to the third embodiment of the present invention. The components provided with the same symbols as those in FIG. 1 are equivalent to those in the first embodiment in FIG. 1. Regarding the solid-state imaging device 1102, as opposed to that in FIG. 1, a correcting unit 124 and a bit converting unit 125 are provided outside the solid-state imaging device 1102. Thus, in the present embodiment, an output unit 1201 corresponding to the output unit 126 is provided. The output unit 1201 is different from the output unit 126 in the first embodiment in FIG. 6 in the following point. The output unit 1201 neither converts a 16-bit signal including a flag into an output format nor outputs the signal to the outside of the solid-state imaging device 1102, but converts only a 13-bit signal including a 1-bit flag, which has been obtained in a replacing unit 122, into an output format and outputs the signal to the outside of the solid-state imaging device 1102.

With the above-described configuration, the amount of data required for an output signal from the solid-state imaging device 1102 can be reduced, enabling reduction of data transfer time. Also, image correction performed by the correcting unit 124 has the tendency of increasing the circuit configuration since, e.g., image correction requires a large volume of storage for temporarily storing, e.g., gamma table in gamma processing, and also requires a large-volume computing unit because of complicated computation. However, as a result of providing the circuit outside the solid-state imaging device 1102, yield enhancement and chip-side reduction for the solid-state imaging device 1102 can be achieved. Also, as a result of providing the correcting unit 124 outside the solid-state imaging device 1102, it may be necessary to change the correction factor for different apparatus types, different gamma coefficients or white balances according to the surrounding image-capturing environments and/or e.g., different conditions for driving the solid-state imaging device 1102. Even for such various changes, flexible adjustment can be made on the system side, without making change of the solid-state imaging device 1102. Here, examples of the surrounding image-capturing environments include outdoor, indoor, daytime, evening and nighttime. Examples of the conditions for driving the imaging device include amplification factor setting and operating temperature.

Although the first to third embodiments have been described in terms of dynamic range improvement technique examples, the present invention provides not only the advantage of dynamic range improvement, but also provides the same advantages for any use of selection of one of a first pixel signal and a second pixel signal for each column in a solid-state imaging device.

According to the first to third embodiments, neither the time lag equivalent to one frame occurs nor the increase in circuit size occurs in a memory unit, and furthermore, the operation speed decrease is prevented, enabling provision of a solid-state imaging device 1 with an enhanced S/N ratio and an expanded dynamic range of signals output therefrom. More specifically, the replacing unit 122 is provided following the bit converting unit 125 that increases the number of bits from that of a signal from the replacing unit 122. Consequently, for use requiring a large number of gray levels such as signals with a high S/N ratio and wide dynamic range, a number of bits in a signal subjected to column A/D conversion can be reduced, and thus, column A/D conversion time can be reduced, enabling provision of a high-speed solid-state imaging device or imaging system. Furthermore, the number of bits in a signal in the circuit preceding the bit converting unit 125 can be reduced. Also, following the replacing units 122, the correcting unit 124 that corrects relative errors between first pixel signals and second pixel signals is provided, eliminating the need for providing a correction circuit, which requires a large volume for performing complicated computation, for each column of the solid-state imaging device, enabling suppression of the circuit size. Also, the solid-state imaging device associates identification information indicating whether the data subsequent to the processing in the replacing unit 122 is a signal derived from a first pixel signal or a second pixel signal with the data. Consequently, the selected signals can easily be distinguished as to whether they are derived from the first pixel signals or the second pixel signals, and thus, image processing can selectively be performed in the following unit, enabling provision of sharing and thus simplification of the circuit.

All of the above-described embodiments are mere specific examples for carrying out the present invention, and the technical scope of the present invention should not be limited by these examples. In other words, the present invention can be carried out in various modes without deviating the technical idea or main features thereof.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2009-276763, filed Dec. 4, 2009, No. 2009-276775, filed Dec. 4, 2009 which are hereby incorporated by reference herein in their entirety.

What is claimed is:
1. An imaging apparatus comprising:
a plurality of pixels, each including a photoelectric conversion element, arranged in a two-dimensional matrix;
a plurality of column amplifiers, each arranged correspondingly to each of columns of the plurality of pixels and configured to output, a first pixel signal derived by amplifying by an amplifying factor p the signal from one of the pixels, and a second pixel signal derived by ampli- fying by an amplifying factor q the signal from the same one of the pixels, wherein the factors p and q are different from each other;

a plurality of column A/D converters, each arranged correspondingly to each of columns of the plurality of pixels and configured to convert the first and second pixel signals outputted from a corresponding one of the plurality of column amplifiers;

a plurality of replacing units, each arranged correspondingly to each of columns of the plurality of pixels, wherein each replacing unit selects, based on a threshold value, either of the first pixel signal converted by the corresponding column A/D converter and the second pixel signal converted by the corresponding column A/D converter; and a horizontal scanning circuit configured to sequentially select the first or second pixel signals selected by the replacing units.

2. The imaging apparatus according to claim 1, wherein within a period of selecting and outputting by the horizontal scanning circuit the pixel signals from one row of the pixels, the column amplifiers, the column A/D converters and the replacing units complete processing of the first and second pixel signals.

3. The imaging apparatus according to claim 1, further comprising a bit converting unit configured to output a pixel signal derived by multiplying by p/q the second pixel signal selected by the horizontal scanning circuit under a condition of p>q.

4. The imaging apparatus according to claim 1, wherein each of the column amplifiers outputs in time series the first and second pixel signals.

5. The imaging apparatus according to claim 1, wherein each column amplifier comprises: a first column amplifier configured to output the first pixel signal multiplied by the factor p; and a second column amplifier configured to output the second pixel signal multiplied by the factor q.

6. The imaging apparatus according to claim 1, further comprising a noise reduction unit, arranged at a stage following one of the column amplifiers, configured to output, to one of the column A/D converters, a difference signal between the signal amplified by the one of the column amplifiers at a reset state of the pixel and the signal amplified by the one of the column amplifiers at a state of releasing reset of the pixel.

7. The imaging apparatus according to claim 1, further comprising a bit converting unit configured to output, based on the first or second pixel signal selected by the horizontal scanning circuit, a pixel signal derived by multiplying the first pixel signal by a first factor to increase a bit number, or a pixel signal derived by multiplying the second pixel signal by a second factor to increase a bit number, wherein the first and second factors are different from each other.

8. The imaging apparatus according to claim 7, further comprising a correcting unit configured to correct a relative error between the first and second pixel signals selected by the horizontal scanning circuit, and to output the corrected first or second pixel signal to the bit converting unit.

9. The imaging apparatus according to claim 7, further comprising a noise reduction unit, arranged at a stage following one of the column amplifiers, configured to output, to one of the column A/D converters, a difference signal between the signal amplified by the one of the column amplifiers at a reset state of the pixel and the signal amplified by the one of the column amplifiers at a state of releasing reset of the pixel.

10. The imaging apparatus according to claim 7, wherein one of the replacing units outputs, to the bit converting unit, a flag signal indicating whether the first pixel signal is selected or the second pixel signal is selected, and the bit converting unit outputs the pixel signal derived by multiplying the first pixel signal by the first factor to increase the bit number, when the flag signal indicates that the first pixel signal is selected, and the bit converting unit outputs the pixel signal derived by multiplying the second pixel signal by the second factor to increase the bit number, when the flag signal indicates that the second pixel signal is selected.

11. The imaging apparatus according to claim 1, further comprising a correcting unit configured to correct a relative error between the first and second pixel signals selected by the horizontal scanning circuit.

12. The imaging apparatus according to claim 11, further comprising a noise reduction unit, arranged at a stage following one of the column amplifiers, configured to output, to one of the column A/D converters, a difference signal between the signal amplified by the one of the column amplifiers at a reset state of the pixel and the signal amplified by the one of the column amplifiers at a state of releasing reset of the pixel.

13. The imaging apparatus according to claim 7, further comprising a bit converting unit configured to output, based on the first or second pixel signal selected by the horizontal scanning circuit, a pixel signal derived by multiplying the first pixel signal by a first factor to increase a bit number, or a pixel signal derived by multiplying the second pixel signal by a second factor to increase a bit number, wherein the first and second factors are different from each other.

14. A driving method of an imaging apparatus comprising a plurality of pixels, each including a photoelectric conversion element, arranged in a two-dimensional matrix, the method comprising;

a column amplifying step of amplifying, column by column, and outputting a first pixel signal derived by amplifying by an amplifying factor p the signal from one of the pixels, and a second pixel signal derived by amplifying by an amplifying factor q the signal from the same one of the pixels, wherein the factors p and q are different from each other;

a column A/D conversion step of converting, column by column, the first and second pixel signals amplified in the column amplifying step;

a replacing step of selecting, based on a threshold value, either of the first or second pixel signal, column by column; and a horizontal scanning step of sequentially selecting the first or second pixel signal selected in the replacing step.

15. The method according to claim 14, further comprising a step of outputting, based on the first or second pixel signal selected in the horizontal scanning step, a pixel signal derived by multiplying the first pixel signal by a first factor to increase a bit number, or a pixel signal derived by multiplying the second pixel signal by a second factor to increase a bit number, wherein the first and second factors are different from each other.

16. The method according to claim 14, further comprising a step of correcting a relative error between the first and second pixel signals selected in the horizontal scanning step, and of outputting the corrected first or second pixel signal to the bit converting unit.

17. The method according to claim 14, further comprising a step of outputting, based on the first or second pixel signal selected in the horizontal scanning step, a pixel signal derived by multiplying the first pixel signal by a first factor to increase a bit number, or a pixel signal derived by multiplying the second pixel signal by a second factor to increase a bit number, wherein the first and second factors are different from each other.

* * * * *